United States Patent
Jochemsen et al.

(10) Patent No.: US 10,712,672 B2
(45) Date of Patent: Jul. 14, 2020

(54) METHOD OF PREDICTING PATTERNING DEFECTS CAUSED BY OVERLAY ERROR

(71) Applicant: ASML NETHERLANDS B.V., Veldhoven (NL)

(72) Inventors: Marinus Jochemsen, Veldhoven (NL); Stefan Hunsche, Santa Clara, CA (US); Wim Tjibbo Tel, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/315,026

(22) PCT Filed: Jul. 7, 2017

(86) PCT No.: PCT/EP2017/067074
§ 371 (c)(1),
(2) Date: Jan. 3, 2019

(87) PCT Pub. No.: WO2018/015181
PCT Pub. Date: Jan. 25, 2018

(65) Prior Publication Data
US 2019/0310553 A1  Oct. 10, 2019

Related U.S. Application Data

(60) Provisional application No. 62/365,662, filed on Jul. 22, 2016.

(51) Int. Cl.
*G03F 7/20* (2006.01)

(52) U.S. Cl.
CPC ............ *G03F 7/705* (2013.01); *G03F 7/7065* (2013.01); *G03F 7/70466* (2013.01); *G03F 7/70633* (2013.01)

(58) Field of Classification Search
CPC .. G03F 7/70633; G03F 7/70625; G03F 7/705; G03F 7/70616; G03F 7/70641; G03F 7/7085; G03F 9/7088; G03F 7/7065; G03F 7/70141; G03F 7/70516; G03F 7/70725; G03F 9/7003; G03F 9/7019; G03F 9/7073; G03F 1/44; G03F 1/84; G03F 7/20;
(Continued)

(56) References Cited

U.S. PATENT DOCUMENTS

| 7,587,704 | B2 | 9/2009 | Ye et al. |
| 2011/0027704 | A1 | 2/2011 | Cramer et al. |
| 2012/0053892 | A1 | 3/2012 | Matsuoka et al. |

FOREIGN PATENT DOCUMENTS

TW  200944954  11/2009

OTHER PUBLICATIONS

International Search Report and Written Opinion issued in corresponding PCT Patent Application No. PCT/EP2017/067074, dated Nov. 15, 2017.
(Continued)

*Primary Examiner* — Mesfin T Asfaw
(74) *Attorney, Agent, or Firm* — Pillsbury Winthrop Shaw Pittman LLP

(57) ABSTRACT

A method including determining a first color pattern and a second color pattern associated with a hot spot of a design layout pattern, the design layout pattern configured for transfer to a substrate, and predicting, by a hardware computer system, whether there would be a defect at the hot spot on the substrate caused by overlay error, based at least in part on a measurement of an overlay error between the first color pattern and the second color pattern.

21 Claims, 16 Drawing Sheets

(58) Field of Classification Search
CPC ........ G03F 7/706; G03F 7/70775; G03F 1/42; G03F 9/7026; G03F 9/7069
See application file for complete search history.

(56) References Cited

OTHER PUBLICATIONS

Van Den Heuvel, Dieter, et al.: "Process Window Discovery Methodology Development for Advanced Lithography", Advanced Semiconductor Manufacturing Conference, May 16, 2016, pp. 65-71.
Sah, Kaushik et al: "Process Window Discovery, Expansion and Control of Design Hotspots Susceptible to Overlay Failures", Advanced Semiconductor Manufacturing Conference, May 22, 2017, pp. 415-420.
Ham, Boo-Hyun, et al.: "The use of computational inspection to identify process window limiting hotspots and predict sub-15nm defects with high capture rate", Proc. of SPIE, vol. 10145, Mar. 28, 2017, pp. 101451P-101451P.
Halder, Sandip, et al.: "Connected Component Analysis of Review-SEM Images for Sub-10 nm Node Process Verification", Proc. of SPIE, vol. 10145, Mar. 28, 2017, pp. 101451Y-101451Y.
Halder Sandip, et al.: "Inspection Challenges for Triple Patterning at Sub-14 nm nodes with Broadband Plasma Inspection Platforms", Advanced Semiconductor Manufacturing Conference, May 3, 2015, pp. 19-22.

METHOD OF PREDICTING PATTERNING DEFECTS CAUSED BY OVERLAY ERROR

CROSS-REFERENCE TO RELATED APPLICATIONS

This application is the U.S. national phase entry of PCT patent application no. PCT/EP2017/067074, which was filed on Jul. 7, 2017, which claims the benefit of U.S. provisional application No. 62/365,662, which was filed on Jul. 22, 2016, and which is incorporated herein in its entirety by reference.

FIELD

The present disclosure relates to patterning apparatuses and processes, and more particularly to a method or apparatus to predict patterning defects caused by overlay error.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

SUMMARY

As part of or in association with a patterning process (i.e., a process of creating a device or other structure involving patterning (such as lithographic exposure or imprint), which may typically include one or more associated processing steps such as development of resist, etching, etc.), it is desirable to understand the impact of overlay error in relation to the occurrence of one or more defects when a patterned structure is created using a patterning process. Accordingly, it is desirable to provide, for example, a method and apparatus to predict one or more defects caused by overlay error. If a defect is predicted to be produced on the substrate, one or more processing variables (e.g., dose (including dose blur), focus (including focus blur), optical aberration, substrate positioning, etc.) may be adjusted accordingly to reduce occurrence of a defect in a future patterning process, thereby desirably improving the yield of good devices from the patterning process.

In an embodiment, there is provided a method comprising: determining a first color pattern and a second color pattern associated with a hot spot of a design layout pattern, the design layout pattern configured for transfer to a substrate; and predicting, by a hardware computer system, whether there would be a defect at the hot spot on the substrate caused by overlay error, based at least in part on a measurement of an overlay error between the first color pattern and the second color pattern.

In an embodiment, there is provided a method comprising: obtaining an overlay error threshold between a first color pattern and a second color pattern by simulation of the first color pattern and the second color pattern; and predicting, by a hardware computer system, whether there would be a defect caused by overlay error, based at least in part on the overlay error threshold and a measurement of an overlay error between the first color pattern and the measured color pattern.

In an embodiment, there is provided a method comprising: obtaining a plurality of distance or overlap vectors based on a simulated first color pattern and a simulated second color pattern; and predicting, by a hardware computer system, whether there would be a defect caused by overlay error based on the plurality of distance or overlap vectors and a measurement of overlay error between the first color pattern and the second color pattern.

In an embodiment, there is provided a non-transitory computer program product comprising machine-readable instructions configured to cause a processor to cause performance of a method as described herein.

In an embodiment, there is provided a system comprising: an inspection apparatus configured to measure an overlay error on a substrate; and a defect prediction engine comprising a non-transitory computer program product as described herein. In an embodiment, the system further comprises a lithographic apparatus comprising a support structure configured to hold a patterning device to modulate a radiation beam and a projection optical system arranged to project the modulated onto a radiation-sensitive substrate.

BRIEF DESCRIPTION OF THE DRAWINGS

Embodiments will now be described, by way of example only, with reference to the accompanying drawings in which.

DETAILED DESCRIPTION

Before describing embodiments in detail, it is instructive to present an example environment in which embodiments may be implemented.

Figure 1:
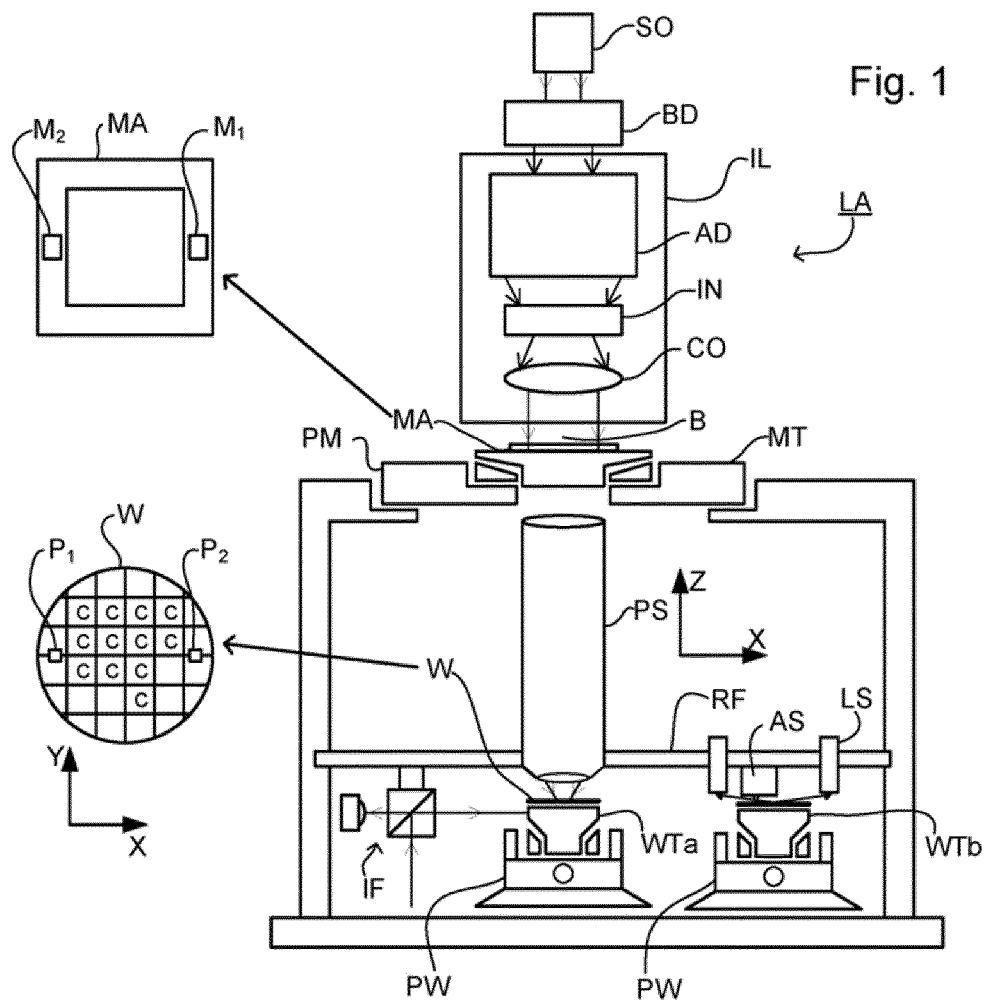
FIG. 1 schematically depicts an embodiment of a lithographic apparatus.

FIG. 1 schematically depicts a lithographic apparatus LA. The apparatus comprises:

- an illumination system (illuminator) IL configured to condition a radiation beam B (e.g. DUV radiation or EUV radiation);
- a support structure (e.g. a mask table) MT constructed to support a patterning device (e.g. a mask) MA and connected to a first positioner PM configured to accurately position the patterning device;
- a substrate table (e.g. a wafer table) WTa constructed to hold a substrate (e.g. a resist-coated wafer) W and connected to a second positioner PW configured to accurately position the substrate; and
- a projection system (e.g. a refractive or reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable minor arrays, and programmable LCD panels. Masks are well known in lithography, and include mask types such as binary, alternating phase-shift, and attenuated phase-shift, as well as various hybrid mask types. An example of a programmable minor array employs a matrix arrangement of small mirrors, each of which can be individually tilted so as to reflect an incoming radiation beam in different directions. The tilted mirrors impart a pattern in a radiation beam, which is reflected by the minor matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable minor array of a type as referred to above, or employing a reflective mask).

The lithographic apparatus may be of a type having two (dual stage) or more tables (e.g., two or more substrate table, two or more patterning device support structures, or a substrate table and metrology table). In such "multiple stage" machines the additional tables may be used in parallel, or preparatory steps may be carried out on one or more tables while one or more other tables are being used for pattern transfer.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WTa may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

The depicted apparatus could be used in at least one of the following modes:

In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa, WTb (e.g., two substrate tables) and two stations—a pattern transfer station and a measurement station—between which the tables can be exchanged. For example, while a substrate on one table is having a pattern transferred thereto at the pattern transfer station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. If the position sensor IF is not capable of measuring the position of a table while it is at the measurement station as well as at the pattern transfer station, a second position sensor may be provided to enable the positions of the table to be tracked at both stations. As another example, while a substrate on one table has a pattern transferred thereto at the pattern transfer station, another table without a substrate waits at the measurement station (where optionally measurement activity may occur). This other table has one or more measurement devices and may optionally have other tools (e.g., cleaning apparatus). When the substrate has completed pattern transfer thereto, the table without a substrate moves to the pattern transfer station to perform, e.g., measurements and the table with the substrate moves to a location (e.g., the measurement station) where the substrate is unloaded and another substrate is load. These multi-table arrangements enable a substantial increase in the throughput of the apparatus.

Figure 2:
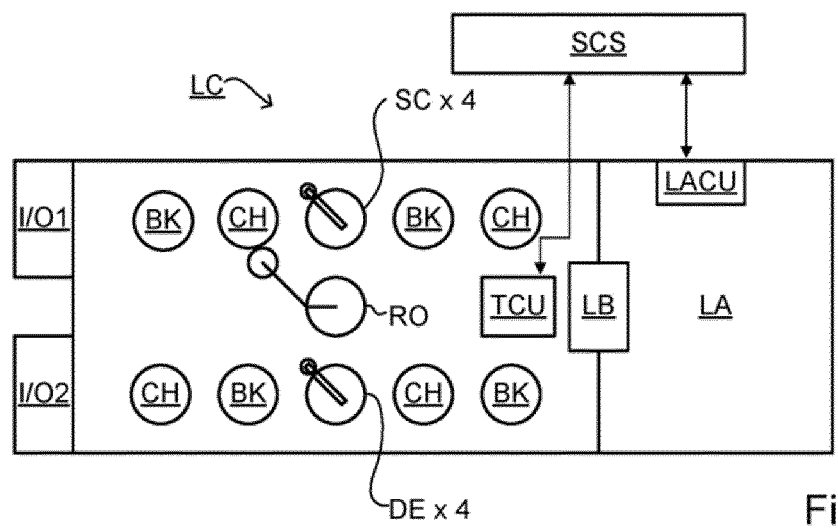
FIG. 2 schematically depicts an embodiment of a lithographic cell or cluster.

As shown in FIG. 2, the lithographic apparatus LA may form part of a lithographic cell LC, also sometimes referred to as a lithocell or lithocluster, which also includes apparatus to perform one or more pre- and post-pattern transfer processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via a lithographic control unit LACU. Thus, the different apparatus may be operated to maximize throughput and processing efficiency.

It is desirable to inspect a patterned substrate to measure one or more properties such as overlay error between subsequent layers, line thickness, critical dimension (CD), etc. If an error is detected, an adjustment may be made to, for example, patterning of one or more subsequent substrates. This may be particularly useful, for example, if the inspection can be done soon and fast enough that another substrate of the same batch is still to be patterned. Also, an already patterned substrate may be stripped and reworked (to improve yield) or discarded, thereby avoiding performing patterning on a substrate that is known to be faulty. In a case where only some target portions of a substrate are faulty, further patterning may be performed only on those target portions which are good. Another possibility is to adapt a setting of a subsequent process step to compensate for the error, e.g. the time of a trim etch step can be adjusted to compensate for substrate-to-substrate CD variation resulting from a lithographic process step.

An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measure one or more properties in the resist layer immediately after patterning. In an embodiment, the measurement may be taken of a latent image in exposed resist. But, the latent image in the resist has a very low contrast—there is only a very small difference in refractive index between the part of the resist which has been exposed to radiation and that which has not. So, measurements may be taken after the post-exposure bake step (PEB) which is customarily the first step carried out on an exposed substrate and increases the contrast between exposed and unexposed parts of the resist. At this stage, the image in the resist may be referred to as semi-latent. Further, in an embodiment and commonly, measurements may be made of the developed resist image—at which point either the exposed or unexposed parts of the resist have been removed—or after a pattern transfer step such as etching. Measuring after etching limits the possibility for rework of a faulty substrate but may still provide useful information, e.g. for the purpose of process control.

Figure 3A:
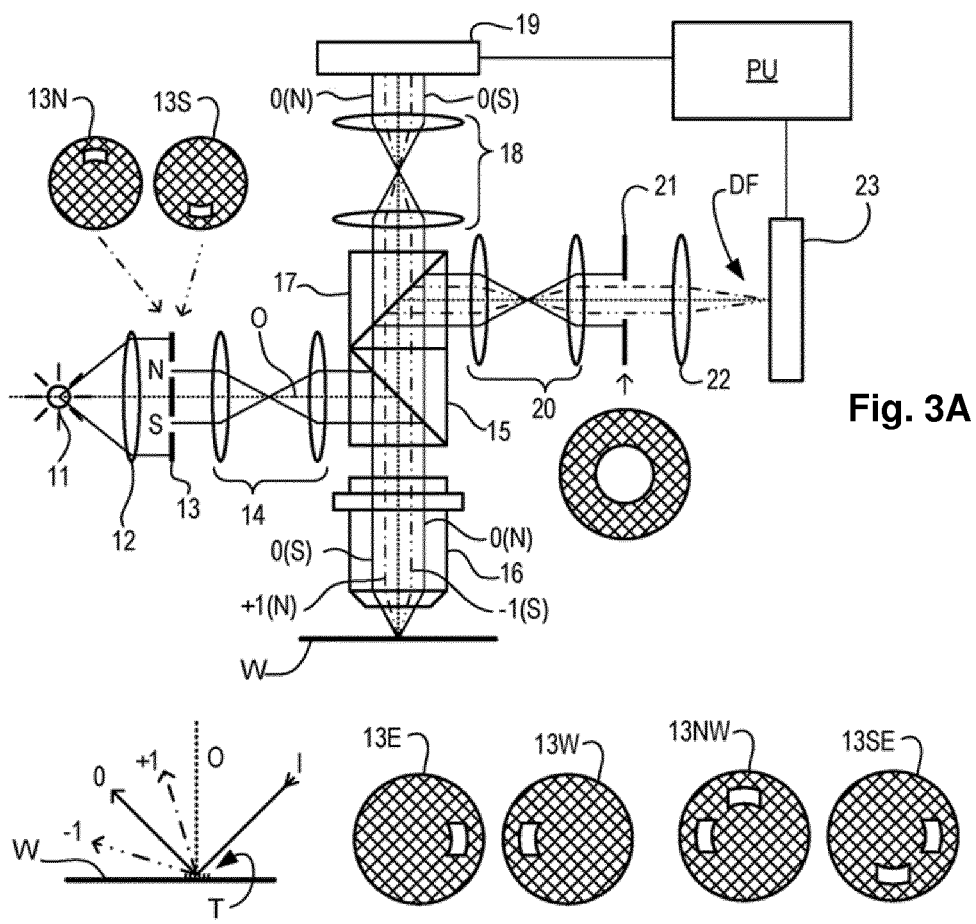
FIG. 3A depicts a schematic diagram of an inspection apparatus (e.g., a dark field scatterometer in this case) configured to measure a target using a first pair of illumination apertures.

An inspection apparatus suitable for use in embodiments is shown in FIG. 3A. A target T and diffracted rays of measurement radiation used to illuminate the target are illustrated in more detail in FIG. 3B. The inspection apparatus illustrated is of a type known as a dark field metrology apparatus. The inspection apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by source 11 (e.g., a xenon lamp) is directed onto substrate W via optical element 15 by an optical system comprising lenses 12, 14 and objective lens 16. These lenses are arranged in a double sequence of a 4F arrangement. A different lens arrangement can be used, provided that it, e.g., provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis radiation from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary radiation outside the desired illumination mode will interfere with the desired measurement signals.

Figures 3B, 3C, 3D:
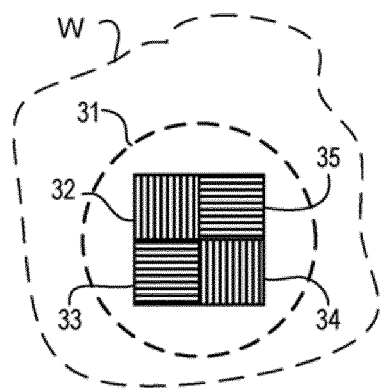
FIG. 3B schematically depicts a detail of a diffraction spectrum of a target periodic structure for a given direction of illumination.
FIG. 3C schematically depicts a second pair of illumination apertures providing further illumination modes in using the inspection apparatus of FIG. 3A for diffraction based measurement.
FIG. 3D schematically depicts a third pair of illumination apertures combining the first and second pair of apertures.

As shown in FIG. 3B, target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and an infinite number of higher order diffracted rays (of which only the $1^{st}$ order are shown as dot-chain line +1 and double dot-chain line −1 in FIG. 3B). It should be remembered that with an overfilled small target, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitches of the targets and the illumination angles can be designed or adjusted so that the first order rays entering the objective lens are closely aligned with the central optical axis. The rays illustrated in FIGS. 3A and 3B are shown somewhat off axis, purely to enable them to be more easily distinguished in the diagram.

At least the 0 and $+1^{st}$ orders diffracted by the target T on substrate W are collected by objective lens 16 and directed back through optical element 15. Returning to FIG. 3A, both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the inspection apparatus and/or normalizing intensity measurements of the first order beam. The pupil plane image can also be used for many measurement purposes such as reconstruction. The pupil plane image for an underfilled target may be used as an input for dose and focus metrology, in accordance with embodiments.

In the second measurement branch, optical system 20, 22 forms an image of the target T on sensor 23 (e.g. a CCD or CMOS sensor). In an embodiment, in the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the periodic structure features as such will not be formed, if only one of the $-1^{st}$ and $+1^{st}$ orders is present.

The particular forms of aperture plate 13 and field stop 21 shown in FIG. 3 are purely examples. In an embodiment, on-axis illumination of the targets is used and an aperture stop with an off-axis aperture is used to pass substantially only one first order of diffracted radiation to the sensor (e.g., zeroth order radiation). In yet other embodiments, 2nd, 3rd and higher order beams (not shown in FIG. 3) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure periodic structures oriented in one direction (X or Y depending on the set-up). For measurement of an orthogonal periodic structure, rotation of the target through 90° and 270° might be implemented. Different aperture plates are shown in FIGS. 3C and 3D. The use of these, and numerous other variations and applications of the apparatus are described in the patent application publications mentioned above.

Figures 4, 5:
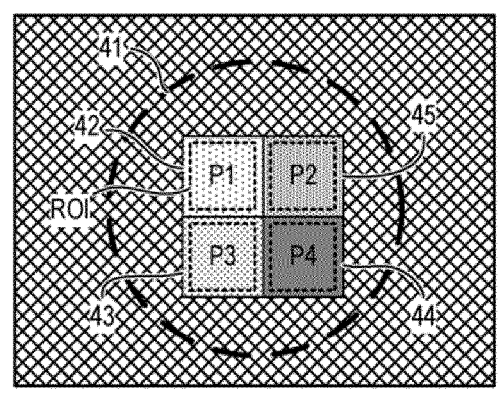
FIG. 4 depicts a form of multiple periodic structure target and an outline of a measurement spot on a substrate.
FIG. 5 depicts an image of the target of FIG. 4 obtained in the inspection apparatus of FIG. 3.

FIG. 4 depicts a (composite) target formed on a substrate according to known practice. The target in this example comprises four periodic structures (e.g., gratings) 32 to 35 positioned closely together so that they will all be within a measurement spot 31 formed by the metrology radiation illumination beam of the inspection apparatus. The four periodic structures thus are all simultaneously illuminated and simultaneously imaged on sensors 19 and 23. In an embodiment, the target has a different form. In an embodiment, the target is a non-functional metrology target except for measurement. In an embodiment, the target comprises one or more (device) product features.

For use as a target dedicated to measurement of overlay, periodic structures 32 to 35 are themselves composite periodic structures formed by overlying periodic structures that are patterned in different layers of, e.g., the semi-conductor device formed on substrate W. In an example dedicated to defocus measurement, periodic structures 32 to 35 are themselves focus-sensitive gratings formed by asymmetric gratings that are patterned in one or more layers (typically a same layer) of, e.g., the semi-conductor device formed on substrate W.

Periodic structures 32 to 35 may also differ in their orientation, as shown, so as to diffract incoming radiation in X and Y directions. In one example, periodic structures 32 and 34 are X-direction periodic structures. Periodic structures 33 and 35 are Y-direction periodic structures. Separate images of these periodic structures can be identified in the image captured by sensor 23. The periodic structures in the different directions can enable measurement of the applicable variable (e.g. overlay) in different directions. This is only one example of a target. A target may comprise more or fewer than 4 periodic structures, or only a single periodic structure.

FIG. 5 shows an example of an image that may be formed on and detected by the sensor 23, using the target of FIG. 4 in the apparatus of FIG. 3, using the aperture plates 13NW or 13SE from FIG. 3D. While the pupil plane image sensor 19 cannot resolve the different individual periodic structures 32 to 35, the image sensor 23 can do so. The dark rectangle represents the field of the image on the sensor, within which the illuminated spot 31 on the substrate is imaged into a corresponding area 41. Within this, rectangular areas 42-45 represent the images of the small target periodic structures 32 to 35. If the targets are located in product areas, product features may also be visible in the periphery of this image field. Image processor and control system PU processes these images using pattern recognition to identify the separate images 42 to 45 of periodic structures 32 to 35. In this way, the images do not have to be aligned very precisely at a specific location within the sensor frame, which greatly improves throughput of the measuring apparatus as a whole. However a desire for accurate alignment remains if the imaging process is subject to non-uniformities across the image field. In an embodiment, four positions P1 to P4 are identified and the periodic structure are aligned as much as possible with these known positions.

Once the separate images of the periodic structures have been identified, the intensities of those individual images can be measured, e.g., by averaging or summing selected pixel intensity values within the identified areas. Intensities and/or other properties of the images can be compared with one another. These results can be combined to measure different variables of the patterning process, such as focus, as illustrated in U.S. Patent Application Publication No. US 2011-0027704, which is incorporated by reference herein in its entirety.

Figure 6:
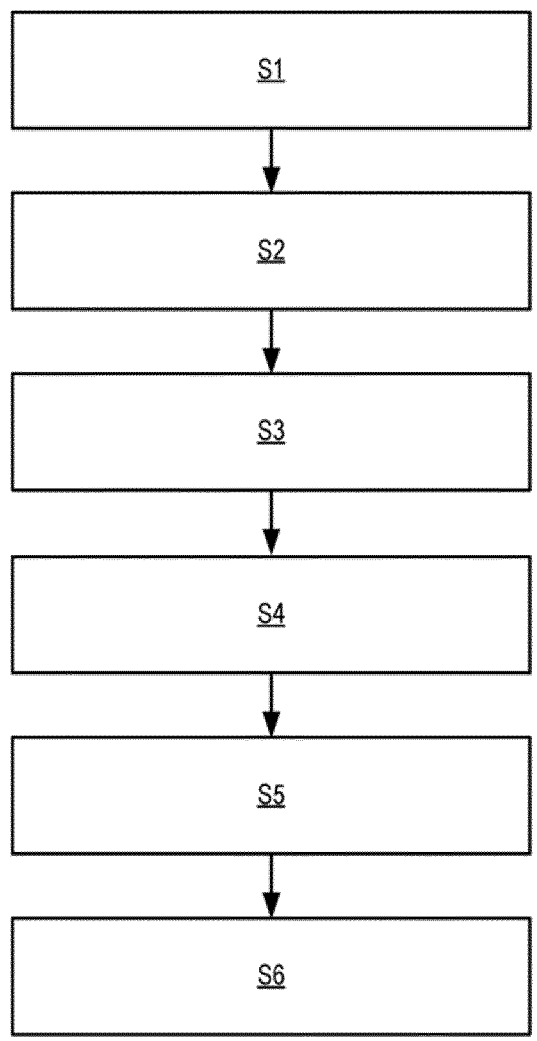
FIG. 6 is a flowchart showing steps of a measurement method using the inspection apparatus of FIG. 3.

FIG. 6 illustrates how a process variable of interest (such as overlay) is measured. At step S1, the substrate, for example a semiconductor wafer, is processed through a lithographic apparatus, such as the lithographic cell of FIG. 2, one or more times, to create a target including, for example, the structures 32-35. At S2, using the inspection apparatus of FIG. 3, an image of at least part of the target is obtained using, e.g., only one of the diffracted orders (say −1 or zero).

In an embodiment, the metrology measurement is done through identifying a target asymmetry, as revealed by comparing the intensities in the $+1^{st}$ order and $-1^{st}$ order dark field images of the target periodic structures (the intensities of other corresponding higher orders can be compared, e.g. $+2^{nd}$ and $-2^{nd}$ orders) to obtain a measure of the intensity asymmetry. In this case, at optional step S3, whether by changing the illumination mode, or changing the imaging mode, or by rotating substrate W by 180° in the field of view of the inspection apparatus, a second image of the periodic structures using another diffracted order (+1) can be obtained; consequently the +1 diffracted radiation is captured in the second image. Note that, by including only half of the first order diffracted radiation in each image, the 'images' referred to here are not conventional dark field microscopy images. The individual target features of the target periodic structures will not be resolved. Each target periodic structure will be represented simply by an area of a certain intensity level.

In step S4, a region of interest (ROI) is identified within the image of each component target structure, from which intensity levels will be measured. Having identified the ROI for each individual target structure and measured its intensity, the process variable of interest (e.g., overlay) can then be determined. This is done (e.g., by the processor PU) in step S5 by evaluating the intensity values obtained, e.g., for zeroth, $+1^{st}$ and/or $-1^{st}$ orders for each target structure 32-35 to identify, e.g., their intensity asymmetry (e.g., any difference in their intensity). The term "difference" is not intended to refer only to subtraction. Differences may be calculated in ratio form. In step S6 the evaluated intensity for a number of target structures are used, optionally together with knowledge of any one or more known variables or parameters (e.g., dimensions) of those target structures, to determine or calculate one or more variables of interest of the patterning process in the vicinity of the target T. In applications described herein, measurements using two or more different measurement recipes may be included.

The process variable of interest (e.g., overlay, CD, focus, dose, optical aberration, etc.) can be fed back (or fed forward) for improvement of the patterning process, improvement of the target, and/or used to improve the measurement and calculation process of FIG. 6 itself.

Further, one or more aspects of the patterning process should be evaluated to enable, for example, determination of whether a defect is likely to occur. To enable this, there may be provided one or more tools used in computationally evaluating those one or more aspects, such as the pattern design for a patterning device, the illumination for the patterning device, the projection of a pattern by a projection, the creation of a pattern in a resist layer, etc. Accordingly, in a system for computationally evaluating a manufacturing process involving patterning, the major manufacturing system components and/or processes can be described by various functional modules, for example, as illustrated in FIG. 6. Referring to FIG. 6, the functional modules may include a design layout module 100, which defines a device design (e.g., integrated circuit, memory or electronic device) pattern; a patterning device layout module 110, which defines how the patterning device pattern is laid out in polygons based on the device design; a patterning device model module 120, which models the physical properties of the pixilated and continuous-tone patterning device to be utilized during the simulation process; a pattern transfer (e.g., an optical) model module 130, which defines the performance of the components that transfer the pattern from the patterning device to the substrate, such as an optical lithography system; a resist model module 140, which defines the performance of the resist being utilized in the given process; a process model module 150, which defines performance of the post-resist development processes (e.g., etch); and a metrology module 160, which defines the performance of a metrology system used with a metrology target and thus the performance of the metrology target when used with the metrology system. The results of one or more of the simulation modules, for example, predicted contours and CDs, are provided in a result module 170.

The properties of the pattern transfer device, such as illumination and projection optics, are captured in the pattern transfer model module 130. Where the pattern transfer is by, e.g., optical lithography, the properties can include, but are not limited to, numerical aperture, sigma (σ) settings as well as any particular illumination source shape, where σ (or sigma) is outer radial extent of the illuminator. The optical properties of the photo-resist layer—e.g., refractive index, film thickness, propagation and/or polarization effects—may also be captured as part of the model module 130, whereas the resist model module 140 describes the effects of chemical processes which occur during pattern transfer to the resist, post pattern transfer bake (sometimes referred to as post exposure bake (PEB)) and development, in order to predict, for example, contours of resist features formed on the substrate. The patterning device model module 120 captures how the design features are laid out in the pattern of the patterning device and may include a representation of detailed physical properties of the patterning device, as described, for example, in U.S. Pat. No. 7,587,704.

The objective of the simulation is to accurately predict, for example, edge placements and CDs, which can then be compared against the device design. The device design is generally defined as the pre-OPC patterning device layout, and will be provided in a standardized digital file format such as GDSII or OASIS.

In general, where the pattern transfer is by, e.g., optical lithography, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of incident energy, which is further modified by diffusion processes and various loading effects. Efficient simulation methods that are fast enough for full-chip applications approximate the realistic 3-dimensional intensity distribution in the resist stack by a 2-dimensional aerial (and resist) image.

Thus, the model formulation describes most, if not all, of the known physics and chemistry of the overall process, and each of the model variables desirably corresponds to a distinct physical or chemical effect (e.g., dose, focus, etc.).

Further, one or more portions of the design layout may be identified, which are referred to as critical features or hot spots. In an embodiment, a set of critical features or hot spots is extracted, which represents the complicated patterns in the design layout (e.g., about 50 to 1000 critical features or hot spots, although any number of critical features or hot spots may be used). As will be appreciated by those skilled in the art, these critical features or hot spots represent small portions (i.e. circuits, cells, patterns or design clips) of the design and especially the critical features or hot spots represent small portions for which particular attention and/or verification is needed. The critical features or hot spots may be identified by experience (including critical features or hot spots provided by a user), by trial and error, or by running a full-chip simulation.

As the dimensions of functional elements made in semiconductor and similar manufacturing processes continue to shrink, accurately printing the intended design layout becomes more challenging, particular printing of high resolution features close to each other. One approach to address this challenge is called "multiple patterning," or sometimes called "multi-patterning." Instead of printing the complete pattern of a single functional layer in the one and same pattern transfer step, multiple patterning may allow for forming the complete pattern on the substrate through a sequence of pattern transfer steps (e.g., exposures alone, exposures in combination with development and etch, etc.), each pattern transfer step being "easier" than a pattern transfer of the complete pattern as a whole in one pattern transfer step.

So, for example, in an embodiment, a complete pattern comprises a plurality of features that are close to each other, in particular so close to each other that they cannot be properly transferred during a same pattern transfer step (e.g., lithographic exposure) using the patterning process. So, the pattern can be decomposed into two or more portions, each of these portions being referred to as a different color. Thus, a first portion of the whole pattern will be referred to as a first color, first color pattern, first color feature, or similar terminology, then a second portion of the whole pattern will be referred to as a second color, second color pattern, second color feature, or similar terminology, and so on. To be sure, color in this context does not refer to a visual perceptual property of the pattern or its portions. Nevertheless, the visual perceptual property typically connoted by the word color (e.g., red, blue, green, etc.) is often used to readily distinguish and identify the different patterns that are not transferred in a same pattern transfer step.

Moreover, a device is often manufactured across a plurality of layers in a stack. Thus, one pattern feature in at least a first layer would be aligned with another pattern feature in at least a second layer. Now, the pattern in the first and/or second layer may be created by multiple patterning (and thus each layer would have its appropriate coloring). However, the first (or second) layer may be created by a single patterning process while the second (or first) layer may be created a multiple patterning process. In this circumstance, the pattern of the first layer may be designated with a color for reference in relation to the pattern in the second layer, including, for example, the plurality of color patterns of the second layer.

Thus, the process of assigning colors to one or more design layout patterns to be printed onto the substrate may be called "coloring." The coloring can thus include applying colors to portions of a decomposed design layout pattern and to applying colors to one or more patterns through a stack of layers.

Returning to decomposing, once a design layout pattern is decomposed, in a basic example, a first portion of the whole pattern (or first color) can comprise a first set of one or more features of the plurality of features, which first set can then be transferred in a first pattern transfer step (e.g., first exposure) without being constrained by one or more other features of the plurality of features that are too close by. Then, a second portion of the whole pattern (or second color) can comprise a second set of one or more other features of the plurality of features, which second set can then be transferred in a second pattern transfer step (e.g., second exposure) without being constrained by the first set that are too close by in the whole pattern if transferred together at once. So, in an embodiment, each portion can be formed using a separate patterning device. In an embodiment, each portion can be formed using a same patterning device (e.g., a programmable patterning device such as a programmable mirror array or programmable LCD array) that is arranged to produce the respective different portions (which, e.g., may include each portion comprising the same pattern but transferred in a manner such that they are spatially separated) at different times.

In an embodiment, each portion arises from using a combination of patterning devices, where the patterning devices may not per se have the pattern corresponding to each or any of the different portions. For example, a spacer and trim mask process is a multiple patterning process to realize the different portions/colors. In a basic example of this process, a first pattern transfer process defines one or more mandrel features. After development and etch, a spacer material is then formed (e.g., by deposition) on one or more of the sidewalls of the one or more mandrel features (e.g., such that the spacer forms a loop around one or more of the mandrel features). Then a second pattern transfer step is used (e.g., using the trim mask, which is also sometimes referred to a cut mask) to trim or cut the spacer into the different portions of the whole pattern. Thus, the multiple portions of the pattern are produced on the substrate without having to transfer the whole pattern with the too close by features in one pattern transfer step.

So, multiple patterning may be useful in overcoming the difficulty of printing a complicated pattern in one pattern transfer step. However, it introduces significant complexity. For example, the pattern needs to be split into the multiple colors and then a plurality of appropriate patterning device patterns need to be designed (which typically involves generating a plurality of patterning devices, e.g., mask). Further, by splitting the transfer of a particular pattern into multiple color features, each subsequent pattern transfer step needs to carefully aligned with the results of one or more previous pattern transfer steps, known as overlay.

One of the simplest cases of multiple patterning is double patterning, where a conventional lithography process is used to produce double the expected number of features by allowing a design layout to be transferred in two pattern transfer steps that often use a different patterning device during each pattern transfer step. For example, a first patterning device may carry certain features used to produce a first portion of the design layout pattern (i.e., a first color) on the substrate. A second patterning device may carry features used to produce a second portion of the design layout pattern (i.e., a second color) on the substrate, where the second portion is too close in the design layout to the first portion to be transferred in a single pattern transfer step. Besides double patterning, multiple patterning may include triple patterning, quadruple patterning, etc. Accordingly, three patterning devices and four patterning devices may be used in the triple patterning and quadruple patterning, respectively. And, while the description herein will focus for simplicity on patterning that splits the portions of the design layout pattern across multiple patterning devices, the techniques described herein can also be applied to processes that use a same patterning device for each pattern transfer step, use a spacer and trim/cut mask type arrangement, etc.

Figure 8:
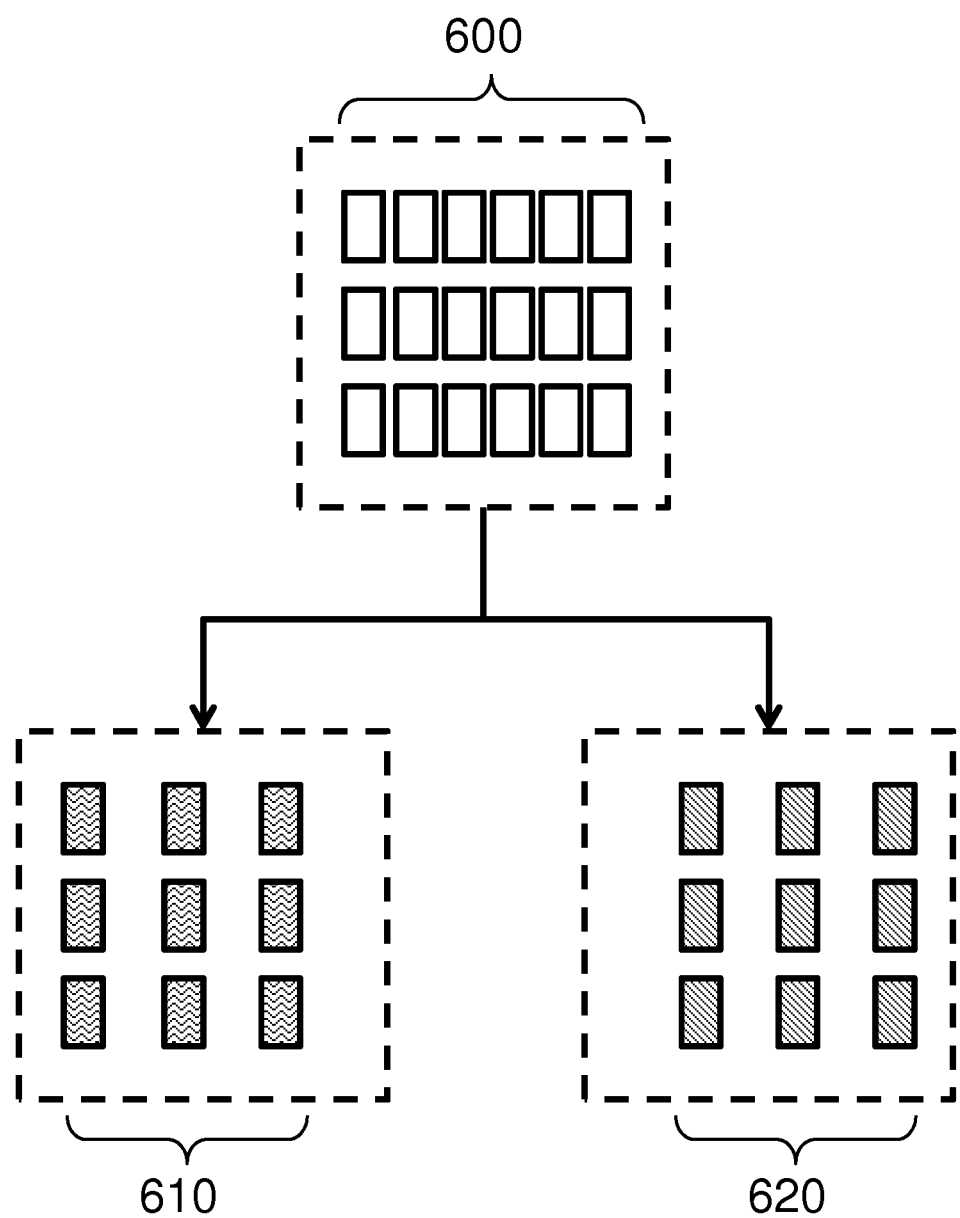
FIG. 8 schematically depicts an example of producing a pattern of a layer of a semiconductor device using a multiple patterning process.

FIG. 8 schematically shows a schematic diagram of producing a pattern 600 of a layer of a semiconductor device using a multiple patterning process. The features in the pattern 600 may be closely positioned to one another, which may make printing them in one pattern transfer step (e.g., lithographic exposure, development and etch) difficult, if not impossible, using a particular patterning process (e.g., using an exposure using 193 nm radiation). If the pattern 600 is "decomposed" into multiple groups of one or more features (e.g., groups 610 and 620) (also known as colors or sub-layouts) and the groups are transferred onto the substrate through multiple pattern transfer steps, the difficulty may well be overcome because the restraint on the pattern transfer step due to the proximity of features to each other discussed above is reduced, if not eliminated. After all the groups of one or more features are printed to the substrate, the entire design layout is printed to the substrate. Namely, the sub-layouts of the design layout (e.g., groups 610 and 620) can be created in, or through the combination of, different pattern transfer steps to yield a single functional layer in the device corresponding to the design layout. Accordingly, each group of features may be referred to a particular color pattern, and each feature of the particular color pattern may be referred to as a particular color feature.

Figure 9:
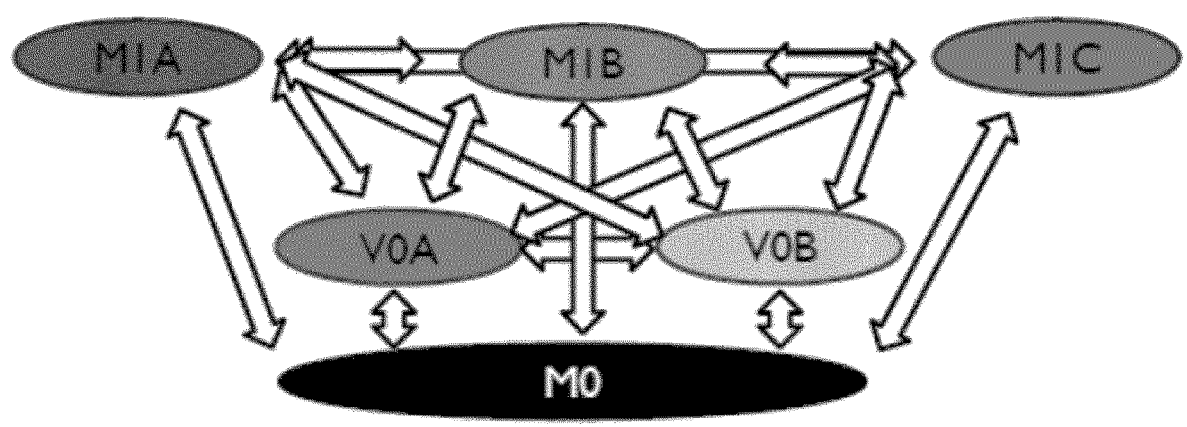
FIG. 9 schematically depicts a stack of layers, wherein in this example one or more of the layers involves multiple patterning.

FIG. 9 depicts an example layer stack, which may be a portion of a semiconductor device. As shown, the layer stack includes three functional layers, i.e., a metal 0 layer (M0), a via 0 layer (V0), and a metal 1 layer (M1). M0 may be produced in one pattern transfer step (e.g., litho and etch). In addition, each of V0 and M1 may be produced on the substrate using a multiple patterning process. Specifically, V0 may be produced on the substrate using a double patterning process. Accordingly, forming V0 on the substrate may include patterning a first color pattern of V0 (i.e., V0A) on the substrate and thereafter patterning a second color pattern of V0 (i.e., V0B) on the substrate. Further, M1 may be produced on the substrate using a triple patterning process. Accordingly, forming M1 on the substrate may include patterning a first color pattern of M1 (i.e., M1A) on the substrate, thereafter patterning a second color pattern of M1 (i.e., M1B) on the substrate, and thereafter patterning a third color pattern of M1 (i.e., M1C) on the substrate. Further, although M0 is not patterned using a multiple patterning process, M0 may be sometimes assigned a color in order to be differentiated from the color patterns of other layers, which other layers may comprises a color pattern produced using a single patterning step or may comprise color patterns produced using a multiple patterning process (e.g., color patterns V0A, V0B, M1A, M1B, and M1C).

In the multiple patterning process, each color pattern may be processed in both a lithographic apparatus (e.g., to expose the substrate) and an etching apparatus (e.g., to etch a resist pattern into a substrate layer). Therefore, the multiple patterning process may be also referred to a sequence of "litho-etch (LE)" processes. For example, a double patterning process may be sometimes referred to as a "LELE" process, triple patterning process may be sometimes referred to as a "LELELE" process, and so on.

Patterning multiple layers and/or performing multiple patterning in a single layer can present overlay issues (i.e., alignment between features in different layers and/or alignment between features exposed in different pattern transfer steps of multiple patterning process) and an overlay error can lead to a defect in the device being produced. Thus, an overlay error may be introduced between or among two or more color patterns (e.g., M0, V0A, V0B, M1A, M1B, and M1C in FIG. 9) in the layer stack, which may be from the same functional layer or different functional layers. The introduced overlay error may change a relative position between two color features, which can cause or lead to a defect. For example, two color features may be designed to have a gap distance between them. If the gap distance is too small (e.g., if the gap distance meets or crosses a threshold distance), a defect may be produced between the two features, e.g., due to optical proximity effect, thereby deteriorating the yield.

Similarly, two color features may be designed to be overlapping or connected. For example, this is where two features from different functional layers are supposed to make contact. In this case an overlay error between the two functional layers will degrade the area of overlap. If, for example, this goes beyond a certain minimum, the desired contact will either fail or show a high electrical resistance. So, if there is a gap or a certain amount of incorrect overlapping (e.g., overlapping meets or crosses a respective threshold, e.g., below a minimum overlap, such as zero overlap), a defect may be produced between the two features, thereby deteriorating the yield. While the discussion hereafter will mostly focus on embodiments involving gap distance, the same concepts apply to overlapping (e.g., the amount of overlapping must exceed or equal a certain threshold, or not be below or equal to a certain threshold).

Figure 10A:
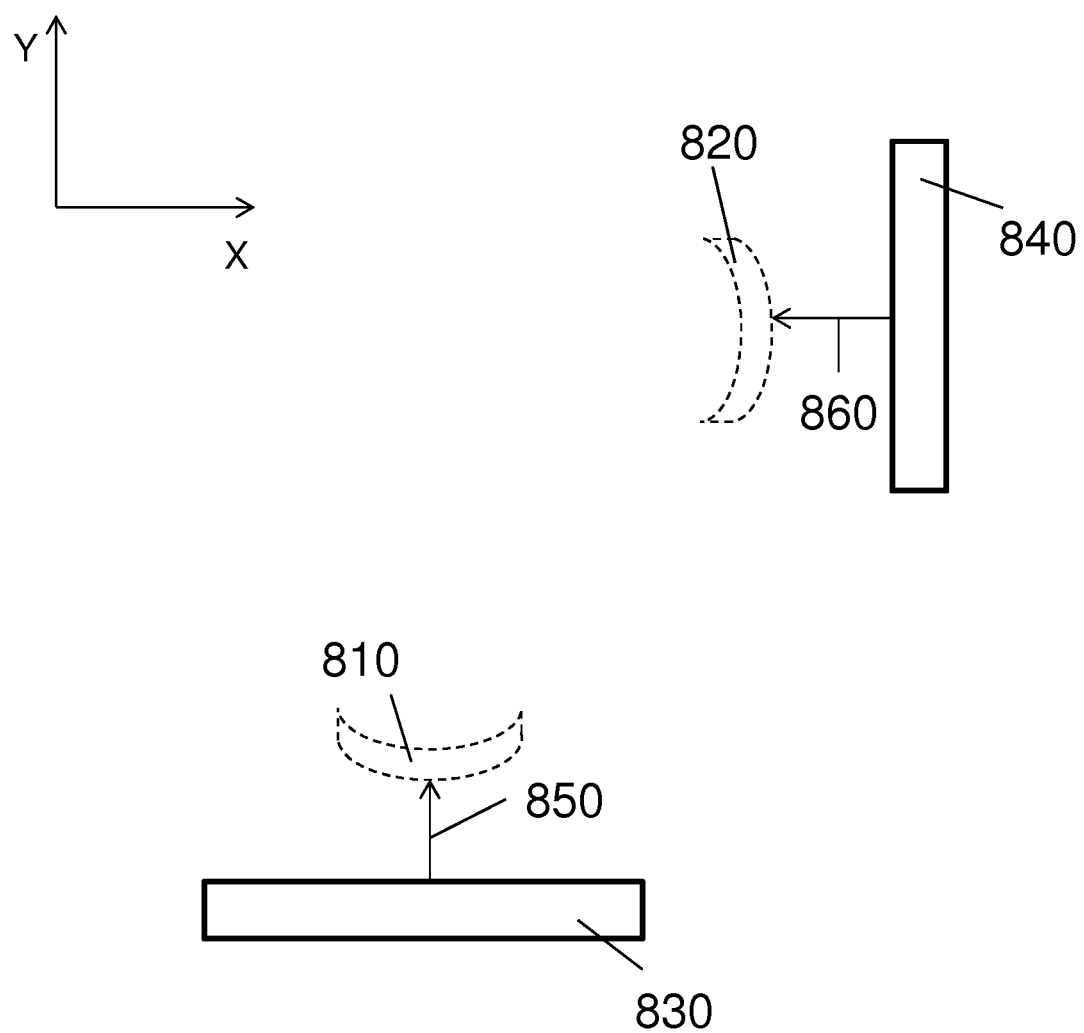
FIG. 10A schematically depicts an example of a first color pattern and a second color pattern without overlay error.

FIG. 10A depicts an example of a first color pattern and a second color pattern without an overlay error. As shown, the first color pattern may include first color features 810, 820 (represented by dashed lines), and second color pattern may include second color features 830, 840 (represented by solid lines). The first color pattern and the second color pattern may be from a same functional layer, or different functional layers.

The relative position between two different color features may be represented by a distance or overlap vector. For example, the amplitude of a distance vector may indicate the minimal gap distance between the two features or amount of overlap between the two features. The direction of the distance vector may indicate a relative position of the end of the minimum gap distance at the first color feature with respect to the end of minimum gap distance at the second color feature, or vice versa. The direction of the overlap vector may indicate a relative position of a central area or point of the first color feature with respect to a central area or point of the second color feature, or vice versa. For example, a first distance vector 850 may be associated with a minimum gap distance between first color feature 810 and second color feature 830 and the direction of the first distance vector 850 indicates that the end of the minimum gap at the first color feature 810 is oriented in the +Y direction relative to the end of minimum gap at the second color feature 830 and that the minimal gap distance is represented by the amplitude of the first distance vector 850. For another example, a second distance vector 860 may be associated with a minimum gap distance between first color feature 820 and second color feature 840 and the direction of the first distance vector 860 indicates that the end of the minimum gap at the first color feature 820 is oriented in the −X direction relative to the end of minimum gap at the second color feature 840 and that the minimal gap distance is represented by the amplitude of the first distance vector 860.

Figure 10B:
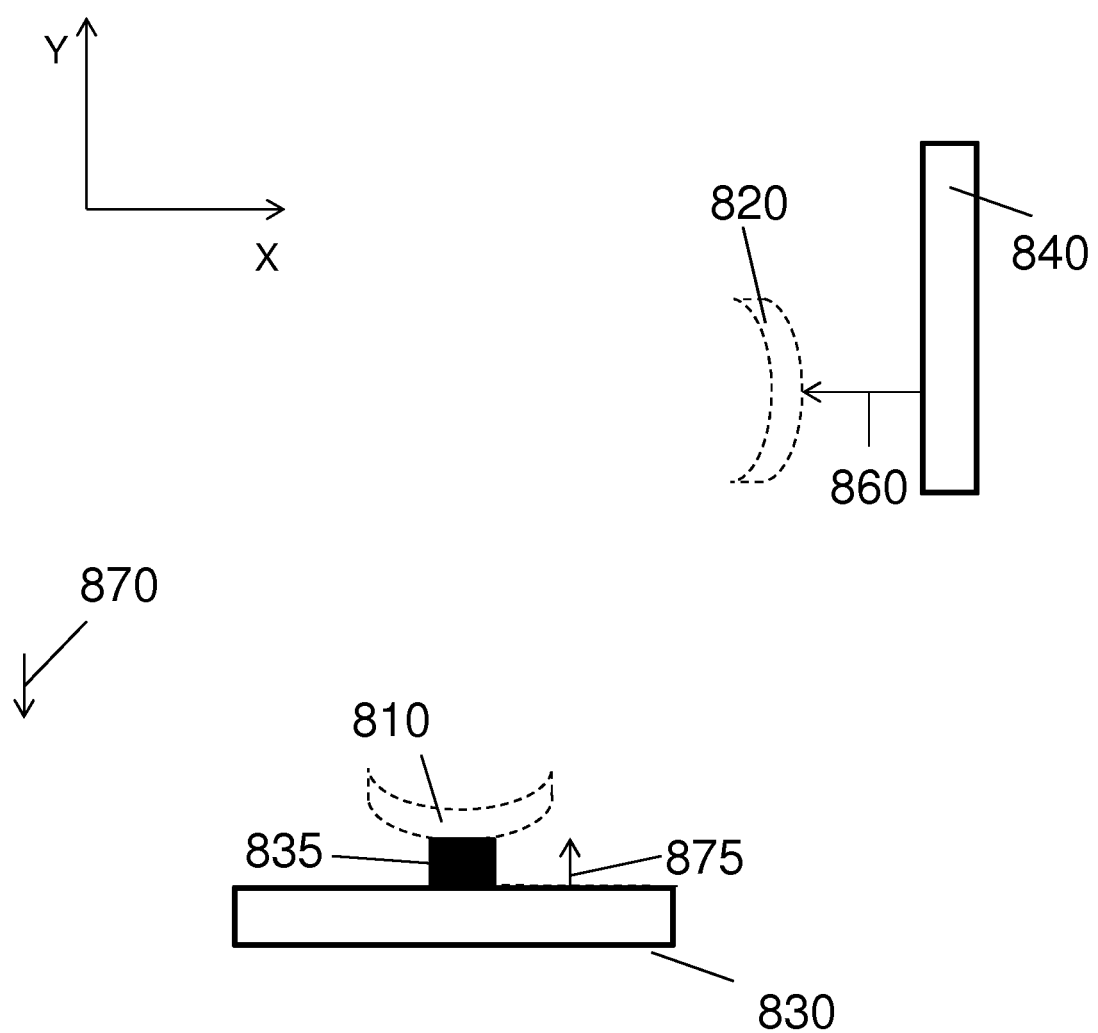
FIG. 10B schematically depicts an example of a defect produced due to an overlay error between a first color pattern and a second color pattern.

FIG. 10B depicts an example of a defect 835 produced due to an overlay error. As shown, an overlay error represented by an overlay error vector 870 is introduced, e.g., during the patterning process, between the first color pattern (i.e., features 810 and 820) and the second color pattern (i.e., features 830, 840). In this example, the overlay error may be defined as the overlay error of the first color pattern with respect to the second color pattern. Accordingly, the overlay error vector 870 may indicate that a value of the overlay error denoted by the amplitude of the overlay error vector 870 is introduced to the first color pattern with respect to the second color pattern along the −Y direction. Due to the overlay error, the minimal gap distance between the first color feature 810 and the second color feature 830 is significantly reduced as indicated by the first distance vector 875. As a result, a defect 835 will be or can be produced between features 810 and 830 when, e.g., the amplitude of the first distance vector 875 crosses or meets a defect threshold or the amplitude (or a combination of the amplitude and direction) of the overlay error vector 870 crosses or meets a defect threshold. So, in this case, when the first color pattern and the second color pattern are from the same functional layer, the defect 835 may be a bridging defect. As shown, the minimal gap distance may not be zero when a defect is likely to occur. This may be because of a proximity effect when the two features 810 and 830 are so close by that they can be distorted and become connected even if the patterning step is set up so as not transfer them in a connecting fashion.

Figure 10C:
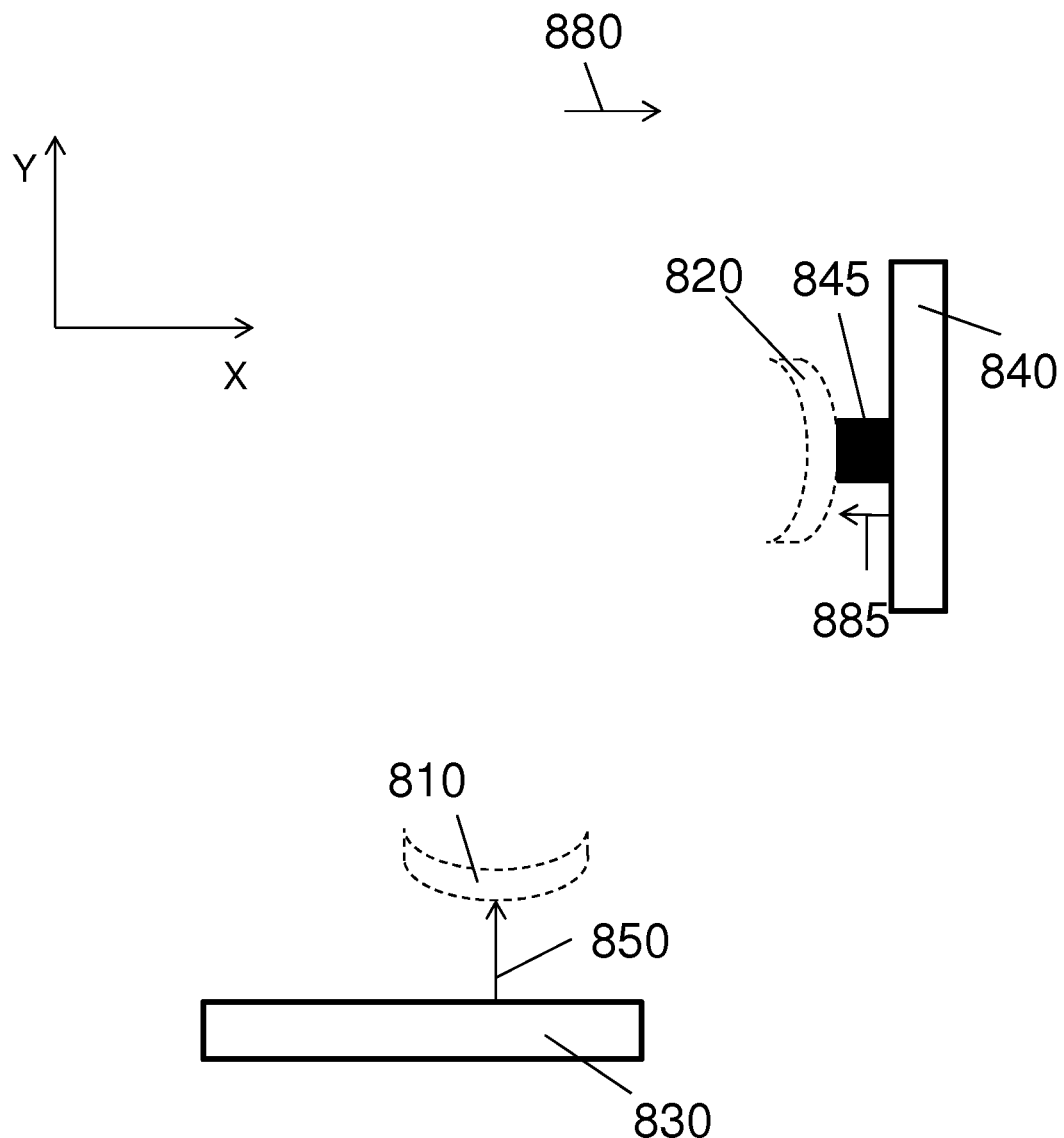
FIG. 10C schematically depicts an example of a defect produced due to an overlay error between a first color pattern and a second color pattern.

FIG. 10C depicts an example of a defect 845 produced due to an overlay error. As shown, an overlay error represented by an overlay error vector 880 is introduced, e.g., during the patterning process, between the first color pattern (i.e., features 810 and 820) and the second color pattern (i.e., features 830, 840). In this example, the overlay error may be defined as the overlay error of the first color pattern with respect to the second color pattern. Accordingly, the overlay error vector 880 may indicate that a value of the overlay error denoted by the amplitude of the overlay error vector 880 is introduced to the first color pattern with respect to the second color pattern along the +X direction. Due to the overlay error, the minimal gap distance between the first color feature 820 and the second color feature 840 is significantly reduced as indicated by the second distance vector 885. As a result, a defect 850 can be or will be produced between the feature 820 and 840 when, e.g., the amplitude of the second distance vector 885 crosses or meets a defect threshold or the amplitude (or a combination of the amplitude and direction) of the overlay error vector 880 crosses or meets a defect threshold. So, in this case, when the first color pattern and the second color pattern are from the same functional layer, the defect 845 may be a bridging defect. As described above, the minimal gap distance may not be zero when a defect is likely to occur. This may be because of a proximity effect when the two features 820 and 840 are so close by that they can be distorted and become connected even if the patterning step is set up so as not transfer them in a connecting fashion.

It is desirable to provide, for example, a method and apparatus to predict a defect caused by overlay error. For example in FIG. 9, it is desirable to predict whether a defect may be produced due to an overlay error between any two or more color patterns. The defect may be a bridging defect if the two or more color patterns are from the same functional layer. The defect may be an interlayer defect if the two or more color patterns are from different functional layers. Relatedly, it is desirable to determine a local overlay requirement to help avoid a defect for the two or more color patterns.

Figure 11:
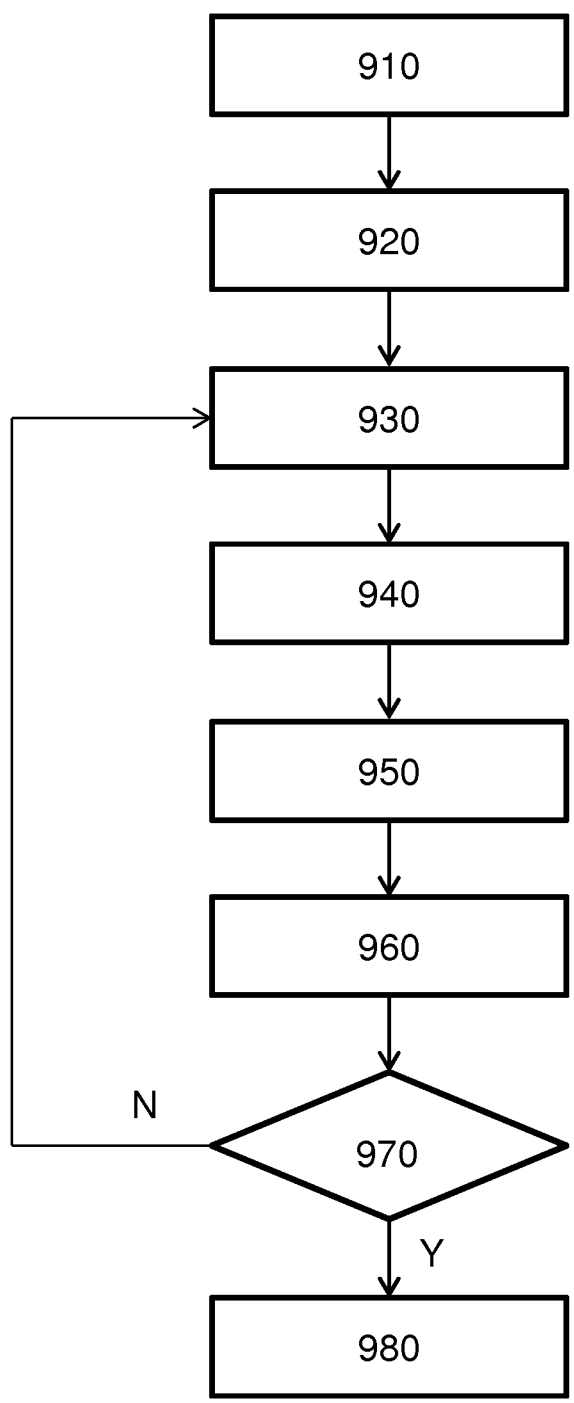
FIG. 11 is a flow diagram illustrating an embodiment of a method of building an overlay threshold database.

FIG. 11 is an example flow diagram illustrating an embodiment of a method of determining overlay threshold data associated with two or more color patterns. For simplicity, this description focuses on two color patterns, but as will be appreciated the method can, or would, be extended to more color patterns. At step 910, a set of processing variables associated with a first color pattern (which may be associated with a first patterning device) and with a second color pattern (which may be associated with a second patterning device) may be obtained. In an embodiment, the processing variables are used to simulate the transfer of the first color pattern and the second color pattern to a substrate. The set of processing variables may include a first set of processing variables associated with the first color pattern, e.g., the dose, focus and/or optical aberration for exposing the first color pattern using the first patterning device. The set of processing variables may further include a second set of processing variables associated with the second color pattern, e.g., the dose, focus and/or optical aberration for exposing the second color pattern using the second patterning device. In some examples, the first set of processing variables may be the same as the second processing variables. Desirably, processing variables are provided for all the color patterns used to produce the device, which is being processed using the first and second color patterns.

At step 920, one or more directions in a direction essentially parallel to a major plane of the substrate onto which the pattern is formed may be determined or selected for determining potential overlay error. In an embodiment, only one direction may be used if the direction of the overlay error between the first color pattern and the second color pattern introduced during the patterning process is known or expected. In an embodiment, a plurality of uniformly separated directions may be determined or selected. For example, 4 directions separated by 90 degrees may be determined or selected (e.g., 0°, 90°, 180°, 270°). For example, 12 directions separated by 30 degrees are determined or selected. For example, 18 directions separated by 20 degrees are determined or selected. For example, 36 directions separated by 10 degrees are determined or selected. In an embodiment, a plurality of non-uniformly separated directions may be determined or selected.

At step 930, one direction of the potential overlay error between the first color pattern and the second color pattern may be obtained. In an embodiment, the obtained direction may be the known direction of the overlay error between the first color pattern and the second color pattern introduced during the patterning process. In an embodiment, the obtained direction may be one of the plurality of uniformly or non-uniformly separated directions as described at step 920.

At step 940, an overlay error threshold (e.g., a minimum overlay error) between a feature of the first color pattern and a feature of the second color pattern in the obtained direction is determined that is determined to likely avoid a defect between the respective features. In an embodiment, the overlay error threshold may be determined by increasing, in a simulation of the transfer of at least the first color pattern and the second color pattern to a substrate (e.g., the simulation can simulate merely the transfer of the first and second color patterns and/or simulate all or some combination of the color patterns of the function device), the overlay error in the obtained direction (e.g., causing a relative shift in the applicable direction essentially parallel to the major plane of the substrate onto which the color patterns are formed) until the simulation based on the applied overlay error in the obtained direction indicates a defect is predicted to be produced on the substrate (e.g., where the first and second patterns are on the same functional layer, that the two features bridge together when otherwise they are expected to be separated). In an embodiment, the overlay error in the simulation may start with a small value based on which no defect is expected to be produced on the substrate and then be increased in small increments. In an embodiment, the defect may be produced when a gap distance (e.g., a minimum gap distance) between a first color feature and a second color feature is less than or equal to a defect threshold value, e.g., a gap distance of 10 nm, 8 nm, 5 nm, 3 nm, 2 nm, 1 nm, 0 nm, etc., which defect threshold value can be set by a user. In an embodiment, the defect may be produced when an overlap (e.g., overlapping area) between a first color feature and a second color feature is less than or equal to a defect threshold value (e.g., a relative proportion such as a percentage selected from the range of 0 to 20%, the range of 1% to 10%, the range of 2% to 8%, etc., or comparable ratio), which defect threshold value can be set by a user. In an embodiment, each feature of the first color pattern that is adjacent a feature of the second color pattern can be checked. In an embodiment, a subset of the respective features of the first and second color patterns (namely expected hot spots or parts of expected hot spots) can be evaluated to help expedite simulation and avoid evaluation of features that are, for example, spaced far enough apart that wouldn't defect without one or more other features already causing a defect due to the particular applied overlay error. Such a subset can include hot spots or parts of expected hot spots, where hot spots are portions of a pattern or device design having a higher likelihood of being defective when transferred to the substrate. Such hot spots can be identified by a user.

At step 950, the value and the direction of the determined overlay error threshold may be stored in conjunction with information regarding the first and second patterns (e.g., color information). In an embodiment, the value and the direction of the determined overlay error threshold may be stored as an overlay error threshold vector. Specifically, the amplitude of the overlay error threshold vector may be the value of the determined overlay error threshold, and the direction of the overlay error threshold vector may be the direction of the determined overlay error threshold. This is can be useful to predict a defect based on a measured overlay error between the first color pattern and the second color pattern as described in FIG. 12.

Optionally, at step 960, the location of the simulated defect may be stored and optionally identified as a potential defect instance or a hot spot. When the first color pattern and the second color pattern are from the same functional layer, the location of the simulated defect may be referred to as a potential bridging instance.

At step 970, it is determined whether the method has been performed for each of the one or more directions determined at step 920. If not, the method returns to step 930. Otherwise, the method is finished at step 980.

In an embodiment, a plurality of sets of processing variables may be obtained. For example, the plurality of sets of processing variables may include a plurality of sets of dose, focus and/or optical aberration values associated with the first color pattern and the second color pattern, respectively. Accordingly, the method as described in FIG. 11 may be repeated for each set of the processing variables. For example, the values of the set of processing variables (e.g., the values of dose, focus and/or optical aberration) for the first and second color patterns can be perturbed to evaluate a process window of the first and second color patterns. Where a plurality of values of the processing variables is used then an overlay error threshold can be recorded for the different sets of values of the processing variables.

Further, the method in FIG. 11 may be conducted for each combination of color patterns in a layer stack of a functional device, e.g., the layer stack in FIG. 9.

Figure 12:
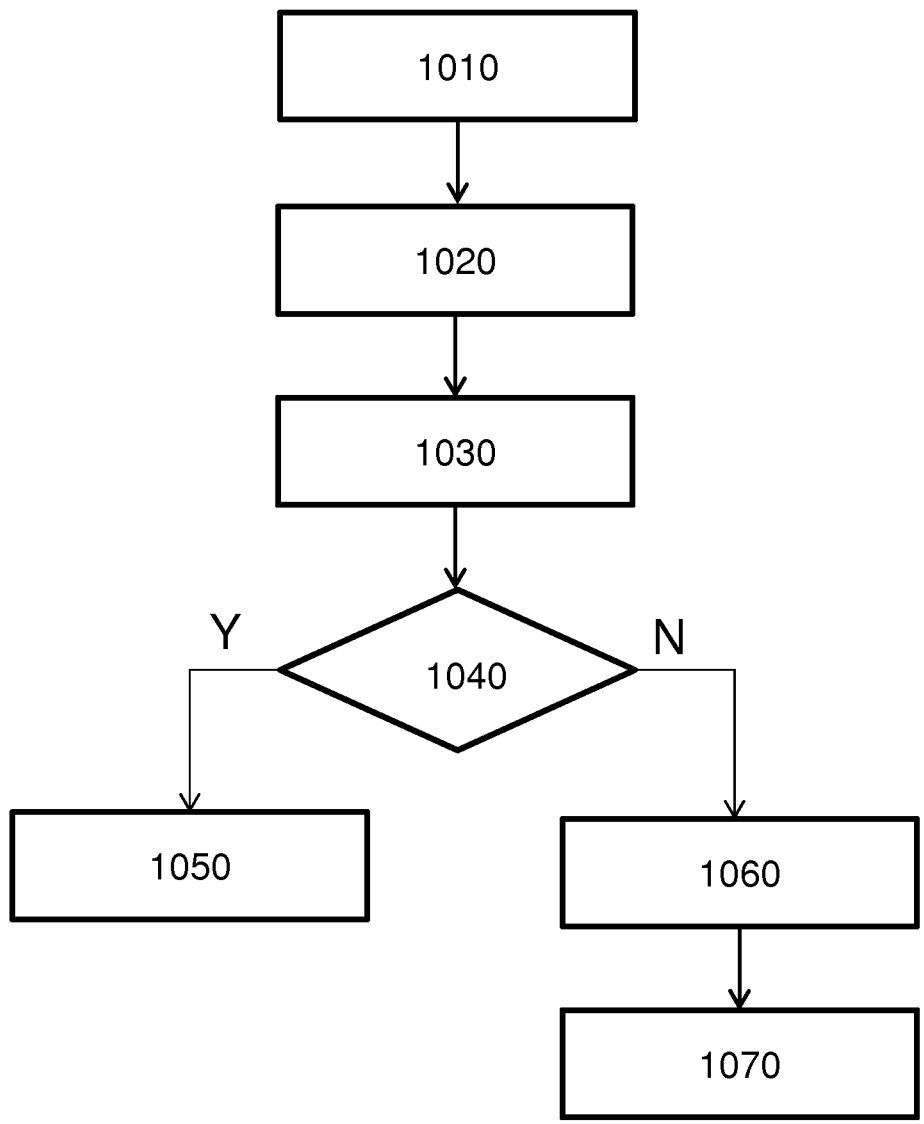
FIG. 12 is a flow diagram illustrating an embodiment of a method of predicting one or more multiple patterning defects caused by an overlay error based on an overlay threshold database.

FIG. 12 is a flow diagram illustrating an embodiment of a method of predicting one or more patterning defects caused by overlay error based on the overlay error threshold data of FIG. 11.

At step 1010, an overlay error measured between the first color pattern and the second color pattern may be obtained, e.g., by measurement using an inspection apparatus at the time after application of the second color pattern and before application of another pattern. The measured overlay error may be used to determine whether a defect has been produced on the substrate due to the measured overlay error. In an embodiment, one or more hot spots can be identified (e.g., by a user) on the substrate. The hot spot information may be used to determine whether a defect has been produced at the hot spot. For example, measured overlay error can be determined for the one or more hot spots. Using the information noted above, the applicable one or more color patterns associated with the hot spot may be determined. For example, it may be determined that the hot spot is associated with the first color pattern and the second color pattern. Thus the overlay error measured between the first color pattern and the second color pattern may be obtained (even though, for example, the area of the hot spot may include multiple color patterns previously or subsequently applied).

At step 1020, optionally, a set of processing variables used to produce the first color pattern and the second color pattern may be obtained. In an embodiment, the set of processing variables may include a first dose, a first focus and/or a first optical aberration for producing the first color pattern and/or a second dose, a second focus and/or second optical aberration for producing the second color pattern.

At step 1030, the one or more applicable overlay error thresholds (i.e., from the data determined in FIG. 11) may be obtained based at least in part on the direction of the measured overlay error and optionally the set of processing variables obtained at step 1020. In an embodiment, the overlay error threshold has the same direction as the measured overlay error. In an embodiment, one or more applicable overlay thresholds are in the form of an overlay error threshold vector.

At step 1040, it is determined whether the measured overlay error has a value below the amplitude of the applicable overlay error threshold. If so, the method proceeds to step 1050, which may predict no defect between the first color pattern and the second color pattern produced on the substrate.

Otherwise, the method proceeds to step 1060, which may predict at least a defect between the first color pattern and the second color pattern produced on the substrate. Optionally, at step 1070, one or more processing variables of the patterning process (e.g., from the set of processing variables) may be adjusted so that the defect due to the measured overlay error may be reduced for a subsequent patterning. The one or more processing variables may be one or more selected from: the first dose, the first focus, the first optical aberration, the second dose, the second focus and/or the second optical aberration. Additionally or alternatively, a signal may be produced to alert of a potential defect. The signal can be used to cause, e.g., rework of the substrate, prevent further patterning of the substrate (e.g., application of further color patterns), etc.

So, in an embodiment, it is desirable to evaluate the impact of local overlay error on, e.g., bridging defects within a single layer or violations of criteria on minimum distance/overlapping area. To enable accurate prediction (e.g., expressed in capture rate/nuisance rate), design information is used, such as color information for multiple patterning. In particular, design and color information for a particular set of features (construct) are used to estimate whether that construct will become a defect or not.

That is, as described above, design information is available for a functional device, including the various color patterns used to construct the device. So, for a particular hot spot within the design, it can be determined which color patterns were used to print the particular features of the hot spot. By knowing this color information, the relevant measured overlay error can be selected for evaluation of the set of features. For example, for a particular hotspot that is present in the design, M1A versus M1B overlay may cause bridging of two features. Specifically, simulation can determine that the particular overlay error amount between the features of M1A and M1B can yield a defect (e.g., by evaluation against a defect threshold). Thus, it is now known that M1A versus M1B overlay should be evaluated for these features. Also, the local overlay limit for this particular set of features (construct) can be determined, namely the overlay error threshold (e.g., the amount of overlay error that can be tolerated for these features before a defect threshold is crossed or matched). So, in this example, then in defect prediction, the design information (color information) can be used to determine the local overlay error information that is relevant for the hotspot (feature construct), namely measured M1A versus M1B overlay, and the applicable local overlay limit for the hotspot (feature construct). The applicable measured overlay can then be evaluated against the applicable local overlay limit to determine whether a defect is likely or not.

Figure 7:
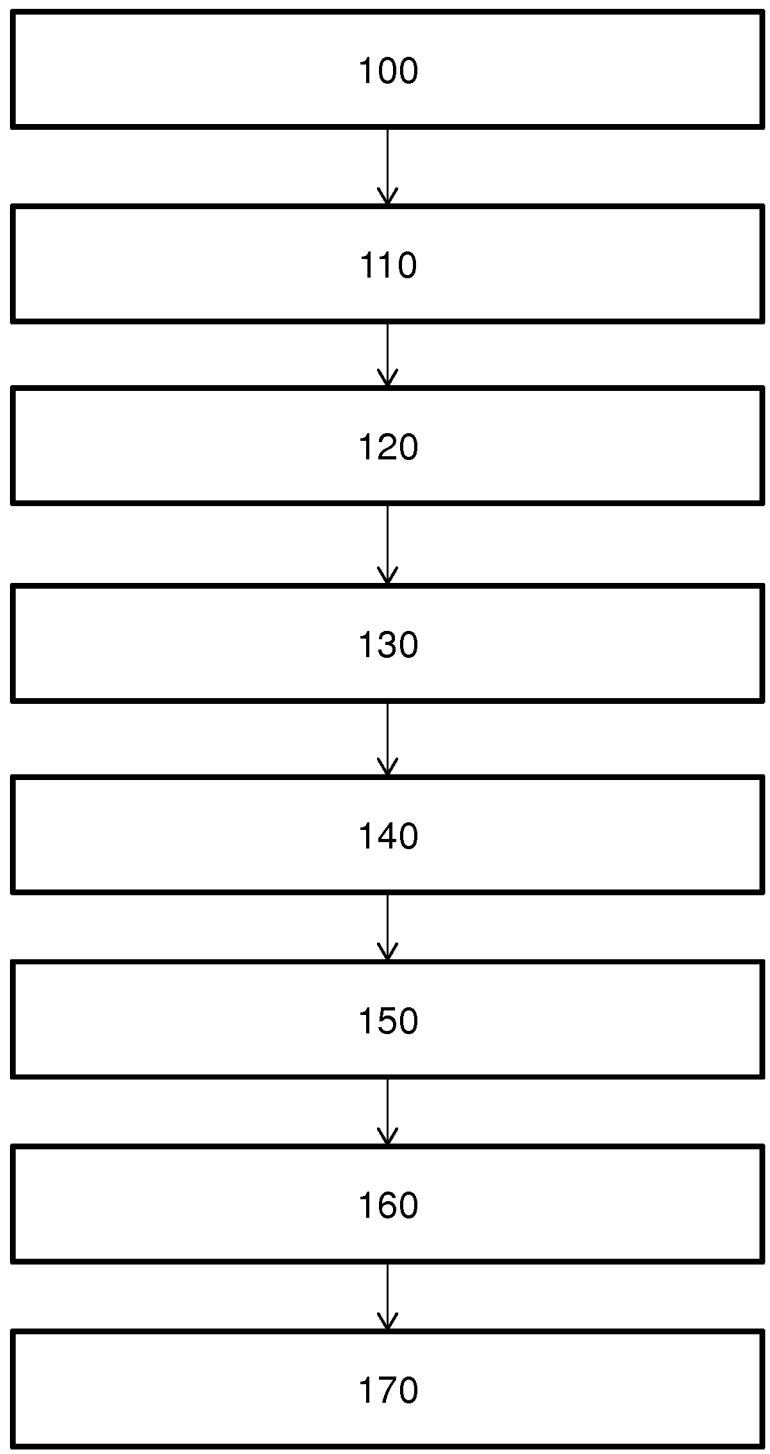
FIG. 7 schematically depicts an embodiment of a system to computationally evaluate a patterning process.

As noted above, simulations may be performed to evaluate instances of possible defects occurring between different color patterns using a model(s) as described in reference to FIG. 7. In an embodiment, simulations are performed for each color pattern (e.g., M1A or M1B) of a plurality of color patterns (e.g., M1A-M1C). In particular, simulations may be performed, in pairs, for each color pattern with respect to another color pattern (e.g., M1A-M1B, M1A-M1C, M1B-M1C) using a model(s) as described in reference to FIG. 7. As will be appreciated, each simulation may account for prior color patterns applied (e.g., simulation of M1B-M1C may account for prior color pattern M1A). Each set of simulations may employ a respective nominal set of processing variables for the respective color pattern, e.g., dose, focus and/or optical aberration associated with the first color pattern and second color pattern, respectively. In addition, each simulation may simulate a portion of the two color patterns in a same area of a field on the substrate. Such simulation may repeat for all the areas of the field.

Figure 13:
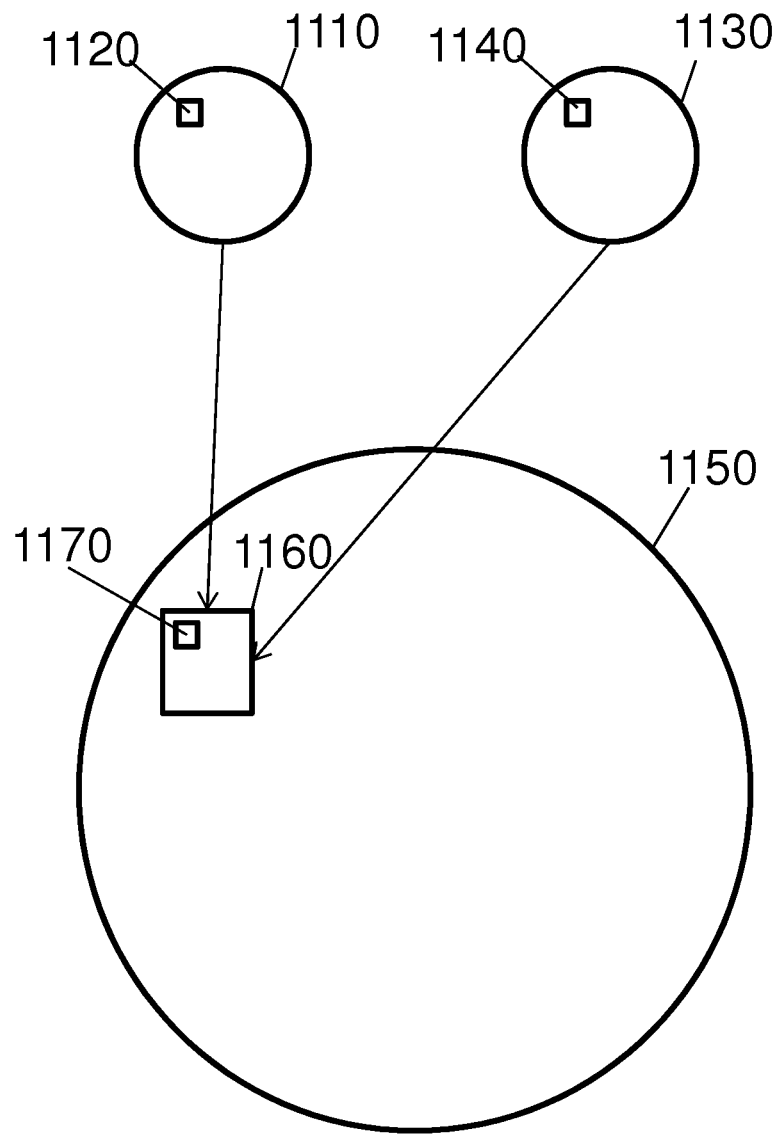
FIG. 13 schematically depicts a process of simulating an area of a field exposed on the substrate using a portion of a first patterning device and a portion of a second patterning device.

FIG. 13 schematically depicts an example of simulating a portion of a first color pattern and a portion of a second color pattern in a same area 1170 of a field 1160 to be exposed on the substrate 1150 using a portion 1120 of a first patterning device 1110 and a portion 1140 of a second patterning device 1130. In an embodiment, the area 1170 of the field 1160 has an area in the range of 900 µm² to 1,000,000 µm² e.g., with dimensions in range of 30 µm×30 µm to 1000 µm×1000 µm (of course, the length and width do not need to be equal). It should be appreciated that the dimensions above are just examples, and are non-limiting.

Figure 14:
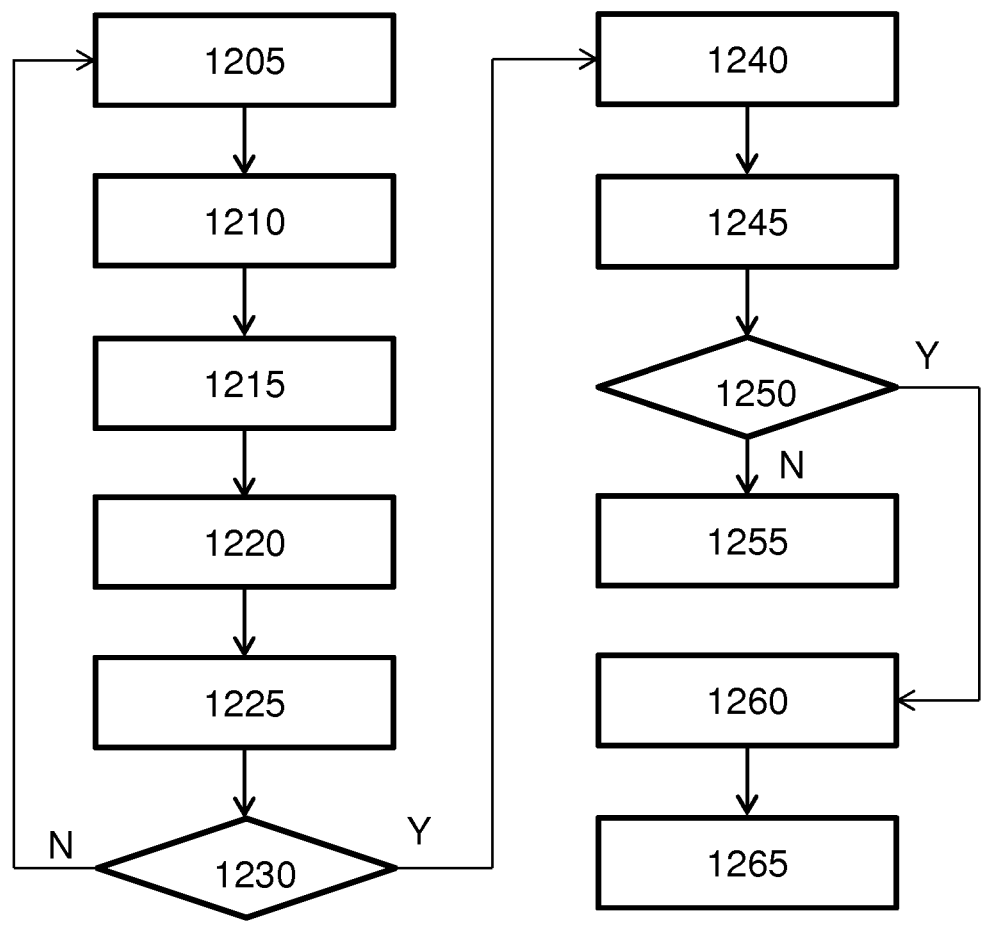
FIG. 14 is a flow diagram illustrating an embodiment of a method of predicting one or more multiple patterning defects caused by an overlay error.

FIG. 14 is a flow diagram illustrating an embodiment of a method of predicting one or more patterning defects caused by an overlay error.

At step 1205, a set of processing variables used to produce a portion of a first color pattern and a portion of a second color pattern in a particular area of a field on the substrate may be obtained. The portion of the first color pattern may be produced using a portion of a first patterning device, and the portion of the second color pattern may be produced using a portion of a second patterning device. In an embodiment, the set of processing variables may include a first dose, a first focus and/or a first optical aberration for producing the portion of the first color pattern, and/or a second dose, a second focus and/or a second optical aberration for producing the portion of the second color pattern.

At step 1210, a plurality of potential defect instances or hot spots in the particular area of the field on the substrate associated with the set of processing variables is determined. When the first color pattern and the second color pattern are from the same functional layer, each potential defect instance or hot spot may be a potential bridging instance. More details about this step will be described in respect of, for example, FIG. 15. The particular area of the field is used, for example, to enable correction specifics to the particular area. For example, a correction process or apparatus in the patterning process may have correct resolution at the size of the particular area.

At step 1215, a hot spot profile (e.g., a hot spot map, hot spot graph, etc.) is created based on the plurality of potential defect instances or hot spots. Specifically, each data point in the hot spot profile may represent a distance or overlap vector corresponding to, e.g., a gap between a first color feature and a second color feature whose amplitude is smaller than a hot spot threshold or an overlap between a first color feature and a second color feature whose amplitude is smaller than a hot spot threshold. In an embodiment, for the gap distance, the hot spot threshold may be 20 nm, 18 nm, 15 nm, etc. In an embodiment, for the overlap, the hot spot threshold may be a relative proportion such as a percentage selected from the range of 90% to 20%, the range of 60% to 20%, the range of 40% to 20%, etc., or comparable ratio). The hot spot threshold can be set by a user. The hot spot threshold aims to eliminate those distance or overlap vectors that have little or no chance of producing a defect. That is, for example, when the amplitude of a distance or overlap vector is greater than or equal to the hot spot threshold, it is determined that a defect is unlikely to be produced due to an overlay error between the first color pattern and the second color pattern. Or, when the amplitude of the distance or overlap vector is equal to or smaller than the hot spot threshold, it is determined that a defect may be possibly produced due to an overlay error between the first color pattern and the second color pattern. The amplitude of the distance vector may indicate the minimal gap distance between the two features or the overlap between the two features. The direction of the distance or overlap vector may indicate a relative position of a first color feature with respect to a second color feature, or a relative position of the second color feature with respect to the first color feature. In an embodiment, the distance or overlap vectors may be obtained using ASML's Lithographic Manufacturing Check (LMC) tool. In an embodiment, the distance or overlap vector may be plotted in a hot spot profile in the form of a hot spot map or graph as a data point. More details of this step will be described in respect of, for example, FIG. 16.

At step 1220, a region of the hot spot profile is determined, the region excluding all, or substantially all (e.g., more than 80%, more than 90% or more than 95%), the data points in the hot spot profile. The region effectively expands from and surrounds the zero distance or overlap vector to form a region that excludes the data points. In a two-dimensional representation of the data points, the region can represent an area in the form of a polygon, a circle, an oval, or any other suitable shape. In an embodiment, the region is referred to as an overlay process window.

At step 1225, optionally, a zone in the region is determined by effectively shrinking the contour of the region by a defect threshold. In an embodiment, the zone is determined by shrinking the contour of the region toward the center of the region (e.g., the zero distance or overlap vector point) by a distance or overlap characterized by the defect threshold. In the case of the distance vector, the defect threshold may be 10 nm, 8 nm, 5 nm, etc. In the case of the overlap vector, the defect threshold may be a relative proportion such as percentage selected from the range of 0 to 20%, the range of 1% to 10%, the range of 2% to 8%, etc., or comparable ratio. In an embodiment, the zone is referred to as an overlay process window.

At step 1230, it is determined whether the method has been conducted for the whole field. If so, the method proceeds to step 1235. Otherwise, the method returns to step 1205 for another portion of the field on the substrate.

In an embodiment, a plurality of sets of processing variables may be subjected to each area of a field on the substrate. For example, the plurality of sets of processing variables may include a plurality of sets of dose, focus and/or optical aberration values for producing each portion of the first color pattern and each portion of the second color pattern, respectively. Accordingly, the steps 1205-1235 may be repeated for each set of the processing variables.

As noted above, the steps 1205-1235 may be conducted for each pair of color patterns in a layer stack of a functional device, e.g., the layer stack in FIG. 9. Each pair of color patterns may be from a same functional layer or different functional layers.

At step 1240, an overlay error measurement between the first color pattern and the second color pattern on the substrate may be obtained. The measured overlay error may be used to determine whether a defect has been produced on the substrate due to the measured overlay error. In an embodiment, the measured overlay error may be represented by an overlay error vector. The direction of the overlay error vector represents the direction of the measured overlay error, and the amplitude of the overlay error vector represents the magnitude of the measured overlay error.

At step 1245, a defect prediction vector is determined based on the measured overlay error. The defect prediction vector may be determined differently depending on the definition of the overlay errors and the distance or overlap vectors between the first color pattern and the second color pattern. Specifically, when each of the distance or overlap vectors described in step 1215 represents a relative position of a first color feature with respect to a second color feature, and at the same time, the overlay error is defined as the overlay error of the second color pattern with respect to the first color pattern, or when each of the distance or overlap vectors described in step 1215 represents a relative position of a second color feature with respect to the first color feature, and at the same time, the overlay error is defined as the overlay error of the first color pattern with respect to the second color pattern, the defect prediction vector is the same as the overlay error vector representing the measured overlay error. On the other hand, when each of the distance or overlap vectors described in step 1215 represents a relative position of a first color feature with respect to a second color feature, and at the same time the overlay error is defined as the overlay error of the first color pattern with respect to the second color pattern, or when each of the distance or overlap vectors described in step 1215 represents a relative position of a second color feature with respect to the first color feature, and at the same time, the overlay error is defined as the overlay error of the second color pattern with respect to the first color pattern, the defect prediction vector may have the same amplitude as the overlay error vector but an opposite direction as the overlay error vector.

At step 1250, it is determined whether the defect prediction vector causes one or more of the data points outside an applicable overlay process window determined at step 1220/1225 to fall within that overlay process window. For example, the defect prediction vector can be added to one or more applicable data points to determine whether those data points would be shifted to within the overlay process window. Those data points would be indicated as potentially being defective. The data associated with those points (e.g., the associated color patterns and particular features of those features) and/or the overlay process window (e.g., the region of the field) can then be used in monitoring, correction, etc. In an embodiment, the corresponding overlay process window may be selected based on the location whether the overlay error is measured.

One or more steps can be taken to facilitate to such review. For example, certain points can be excluded from review. For example, if the vector extends in the −X and −Y direction, any distance or overlap vectors in the −X and −Y can be excluded; similarly, if the vector extends in the +X and +Y direction, any distance or overlap vectors in the +X and +Y can be excluded.

If it is determined that the defect prediction vector does not cause any data points to fall within the overlay process window, the method proceeds to step 1255 which may predict no defect between the first color pattern and the second color pattern due to the measured overlay error. After step 1255, steps 1240-1250 may be repeated for another overlay process window and/or different measured overlay. For example, this technique can be repeated for each of the portions of the field and/or for the plurality of instances of the transfer of the first and second color patterns across the substrate.

Otherwise, the method proceeds to step 1260, which identifies a prediction of a defect between the first color pattern and the second color pattern produced on the substrate due to the measured overlay error.

Optionally, at step 1265, one or more processing variables of the patterning process (e.g., from the corresponding set of processing variables associated with the first and second color patterns) may be adjusted so that the defect due to the measured overlay error may be reduced. The one or more processing variables may include one or more selected from: the first dose, the first focus, the first optical aberration, the second dose, the second focus and/or the second optical aberration. As described above, the first dose, the first focus and/or first optical aberration are associated with the first color pattern, and the second dose, the second focus and/or second optical aberration are associated with the second color pattern.

After step 1260 or 1265, steps 1240-1250 may be repeated for another overlay process window and/or different measured overlay. For example, this technique can be repeated for each of the portions of the field and/or for the plurality of instances of the transfer of the first and second color patterns across the substrate.

Figure 15:
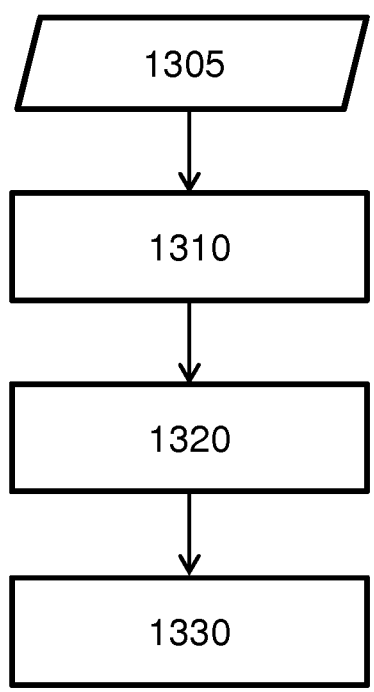
FIG. 15 is a flow diagram illustrating an embodiment of a method of determining a plurality of hot spots.

FIG. 15 is a flow diagram illustrating an embodiment of a method of determining potential defect instances or hot spots on the substrate due to a potential overlay error between the first color pattern and the second color pattern (i.e., step 1210 in FIG. 14).

The method starts with a set of processing variables of the portion of the first color pattern and the portion of the second color pattern as shown in 1305. As described above, the first color pattern may be produced using a first patterning device, and the second color pattern may be produced using a second patterning device. The set of processing variables may include a first dose, a first focus, and/or first optical aberration for producing the portion of the first color pattern. The set of processing variables may further include a second dose, a second focus and/or second optical aberration for producing the portion of the second color pattern.

At step 1310, the portion of the first color pattern and the portion of the second color pattern may be simulated based on the set of processing variables, e.g., using the model(s) described in relation to FIG. 7. The first color pattern and the second color pattern may be from the same functional layer or from different functional layers.

At step 1320, a plurality of distance or overlap vectors between the simulated features of the first color pattern and the simulated features of the second color pattern is determined. In an embodiment, the amplitude of the distance vector may indicate a minimal gap distance between two different color features. In an embodiment, the amplitude of the overlap vector may indicate a relative proportion of overlap between two different color features. In an embodiment, the direction of the distance or overlap vector may indicate a relative position of a first color feature with respect to the second color feature, or a relative position of the second color feature with respect to the first color feature. In an embodiment, the distance vector has a direction corresponding to the direction between the two nearest points of the respective features and has an amplitude corresponding to a shortest distance between the simulated points.

At step 1330, a plurality of hot spots may be determined based on the plurality of distance or overlap vectors obtained at step 1320. Each hot spot is associated with one of the plurality of distance or overlap vectors having an amplitude within a hot spot threshold. In an embodiment, for a distance vector, the hot spot threshold may be 20 nm, 18 nm, 15 nm, etc. The hot spot threshold may be set by a user.

Figure 16:
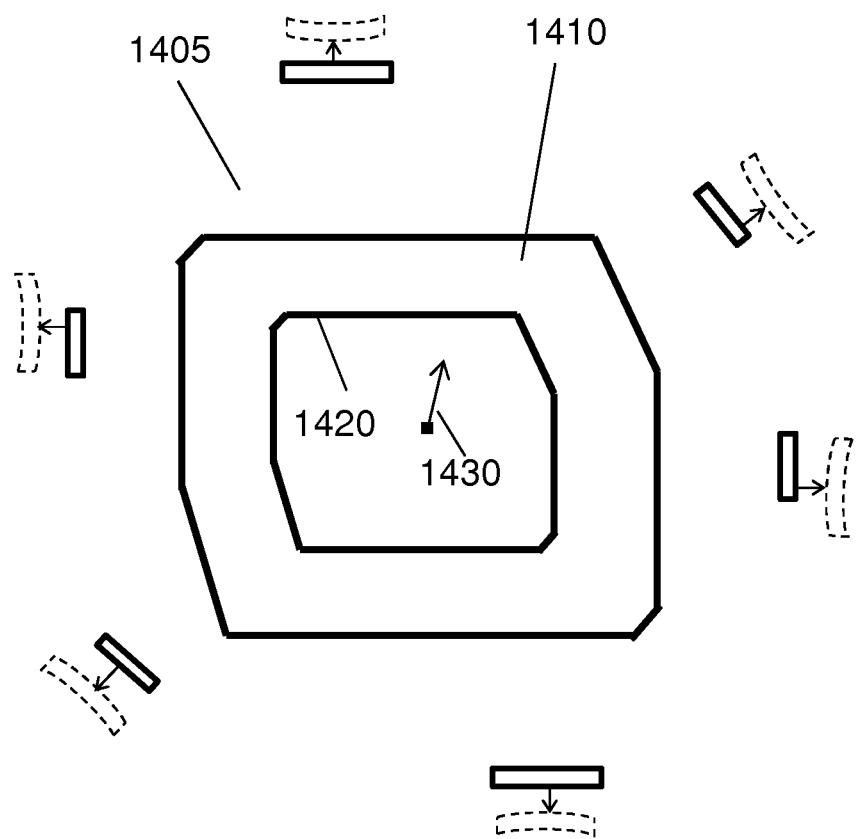
FIG. 16 schematically depicts an embodiment of a process of predicting one or more multiple patterning defects caused by an overlay error.

FIG. 16 schematically depicts an embodiment of a process of predicting a patterning defect caused by an overlay error. As shown, a hot spot area 1405 includes a plurality of data points. Each data point may represent a distance or overlap vector between a first color feature (represented in dashed lines) and a second color feature (represented in solid lines) whose amplitude is within the hot spot threshold (e.g., 15 nm for a distance vector). In this example, each distance or overlap vector directs from the second color feature toward the first color feature. Therefore, each of the distance or overlap vectors may represent a relative positon of the first color feature with respect to the second color feature. In other examples, each of the distance or overlap vectors may represent a relative position of the second color feature with respect to the first color feature. Accordingly, the corresponding distance or overlap vectors may have opposite directions of the distance or overlap vectors in FIG. 16 and the same amplitudes as the distance or overlap vectors in FIG. 16. In addition, a region 1410 (e.g., polygon area) may be determined inside the hot spot profile that excludes all, or substantially all, the data points. In an embodiment, the region 1410 may be referred to as an overlapping overlay process window. It should be appreciated that the shape of the region 1410 is non-limiting as long as the region 1410 excludes all, or substantially all, the data points in the hot spot area 1405.

Further, optionally, a zone 1420 inside the region 1410 may be created by shrinking the contour of the region toward the center of the hot spot area 1405 by a distance or overlap amount characterized by a defect threshold (e.g., 5 nm for a distance vector). This may be done by determining a plurality of points on the contour of the region 1410, shifting each of the plurality of points toward the center by a distance or overlap amount characterized by the defect threshold (e.g., 5 nm for a distance vector), and then connecting the shifted plurality of points. In an embodiment, the zone, like the region 1410, may be referred to as an overlapping overlay process window. In an embodiment, the defect threshold may be varying such that the shape of the zone does not match the shape of the region.

Whether a defect is produced between the first color pattern and the second color pattern may be predicted based on a measured overlay error between the first color pattern and the second color pattern. Specifically, a defect prediction vector 1430 is created based on the measured overlay error. The defect prediction vector 1430 may be determined differently depending on the definitions of the distance or overlap vectors and the overlay errors. For example, when each of the distance or overlap vectors represents a relative position of a first color feature with respect to a second color feature, and at the same time, the overlay error is defined as the overlay error of the second color pattern with respect to the first color pattern, or when each of the distance or overlap vectors represents a relative position of a second color feature with respect to the first color feature, and at the same time, the overlay error is defined as the overlay error of the first color pattern with respect to the second color pattern, the defect prediction vector is the same as the overlay error vector representing the measured overlay error. On the other hand, when each of the distance or overlap vectors represents a relative position of a first color feature with respect to a second color feature, and at the same time, the overlay error is defined as the overlay error of the first color pattern with respect to the second color pattern, or when each of the distance or overlap vectors represents a relative position of a second color feature with respect to the first color feature, and at the same time, the overlay error is defined as the overlay error of the second color pattern with respect to the first color pattern, the defect prediction vector may have the same amplitude as the overlay error vector but an opposite direction as the overlay error.

As shown in FIG. 16, the defect prediction vector 1430 is shown for convenience within the zone 1420. The defect prediction vector is used to identify whether data points outside the zone 1420/region 1410 will fall within the zone 1420/region 1410 (or remain outside) when the defect prediction vector is applied the data points. For example, when a data point falls within the zone 1420/region 1410, a defect can be predicted due to the measured overlay error between the first color pattern and the second color pattern.

So, in an embodiment, there is provided a prediction of a defect location by combining hot spot information with one or more overlay measurements. In an embodiment, this is done by computational characterization of potential defects relative to various overlay errors. That is, the method enables a user to find patterning defects by combining an overlay measurement with pre-characterized hot spots and an overlay process window to determine whether a measured overlay will likely yield a defect or not. Since a virtual inspection system is effectively provided, the defect size can be small (e.g., smaller than what can be detected with a traditional (optical) inspection system).

As described above, the simulation is performed as a set-up step (e.g., just once) for a particular pattern (e.g., a particular mask). For example, for a part of the pattern in the field at the substrate, the patterning process is simulated to find potential defects, e.g., bridging instances between the pattern and any all other relevant color patterns. A defect threshold can be applied to identify only potential defects below a certain size (e.g., a gap of 15 nm or less). An overlay process window can be defined to provide a boundary nearest to the zero size (where a defect will certainly occur) that keeps all, or substantially, all the identified defects at or outside the boundary. In an embodiment, an offset can be provided to shrink overlay process window.

When the actual overlay error is known (e.g., an overlay fingerprint of a substrate), the overlay vector can be applied to determine which, if any, of the identified defects is likely to fall within the overlay process window. Where an identified defect falls within the overlay process window, that combination of features can be identified as likely to be defective. Thus, the most likely defect location for the part of the field can be identified. Further, the process can be repeated for each field across a substrate using the same simulation for the particular field but the different overlay errors at different parts of the substrate. Accordingly, the overlay process window indicates a margin for control; the overlay process window shows the allowed overlay deviations.

Thus, there is provided defect prediction in multiple patterning. In an embodiment, to enable such defect prediction, the concept of an overlay process window is used that is derived from a simulation (e.g., just a single simulation run per set of patterns for a patterning process). The defect prediction allows for pattern aware, layout aware overlay control, which can lead to yield improvement. In an embodiment, the predicting enables predicting of defects on a production substrate so as to help manage, e.g., systematic defects.

While the techniques have focused on overlay, they could be extended to other variables and could also be used as input data for other variables. Such other variables can include, for example, CD, optical aberrations of the patterning process, values representing movement of the substrate during exposure (e.g., per-point moving standard deviation values), etc.

In an embodiment, there is provided a method comprising: determining a first color pattern and a second color pattern associated with a hot spot of a design layout pattern, the design layout pattern configured for transfer to a substrate; and predicting, by a hardware computer system, whether there would be a defect at the hot spot on the substrate caused by overlay error, based at least in part on a measurement of an overlay error between the first color pattern and the second color pattern.

In an embodiment, the predicting comprises: obtaining an overlay error threshold; comparing the measured overlay error with the overlay error threshold; and predicting whether there would be the defect at the hot spot based on a result of the comparing. In an embodiment, the defect is predicted at the hot spot responsive to a value of the measured overlay error being equal to or greater than the amplitude of the overlay error threshold. In an embodiment, no defect is predicted at the hot spot responsive to a value of the measured overlay error being smaller than or equal to the amplitude of the overlay error threshold. In an embodiment, obtaining the overlay error threshold comprises determining a value of an overlay error between the first color pattern and the second color pattern such that a distance or overlap amount between a simulated first color pattern and a simulated second color pattern based on the overlay error satisfies a defect threshold. In an embodiment, the simulated first color pattern is obtained by performing a simulation of the first color pattern based on different values of a processing variable of a patterning process used to transfer the first color pattern to the substrate and/or the simulated second color pattern is obtained by performing a simulation of the second color pattern based on different values of a processing variable of a patterning process used to transfer the second color pattern to the substrate. In an embodiment, the method further comprises, responsive to a prediction there would be the defect, adjusting a processing variable for producing the first color pattern and/or the second color pattern so that the defect caused by the overlay error is expected to be reduced. In an embodiment, the processing variable comprises one or more selected from: a dose for producing the first color pattern, a focus for producing the first color pattern, an optical aberration associated with producing the first color pattern, a dose for producing the second color pattern, a second focus for producing the second color pattern, and/or an optical aberration associated with producing the second color pattern. In an embodiment, the first color pattern and/or the second color pattern includes a feature of an integrated circuit pattern. In an embodiment, the first color pattern is produced on the substrate using at least a portion of a first patterning device, and the second color pattern is produced on the substrate using at least a portion of a second patterning device. In an embodiment, the first color pattern is for a different layer on the substrate than a layer for the second color pattern.

In an embodiment, there is provided a method comprising a method comprising: obtaining an overlay error threshold between a first color pattern and a second color pattern by simulation of the first color pattern and the second color pattern; and predicting, by a hardware computer system, whether there would be a defect caused by overlay error, based at least in part on the overlay error threshold and a measurement of an overlay error between the first color pattern and the measured color pattern.

In an embodiment, the predicting comprises: selecting one of a plurality of overlay error thresholds, the selected overlay error threshold having at least a directional component in the same direction as that of the measured overlay error; comparing the measured overlay error with the selected overlay error threshold; and predicting whether there would be the defect based on a result of the comparing. In an embodiment, it is predicted that there would be the defect responsive to a value of the measured overlay error is equal to or greater than the amplitude of the selected overlay error threshold. In an embodiment, no defect is predicted responsive to a value of the measured overlay error being smaller than or equal to the amplitude of the overlay error threshold. In an embodiment, obtaining the overlay error threshold comprises determining a value of an overlay error between the first color pattern and the second color pattern such that a distance or overlap amount between the simulated first color pattern and the simulated second color pattern based on the overlay error satisfies a defect threshold. In an embodiment, the simulated first color pattern is obtained by performing a simulation of the first color pattern based on different values of a processing variable of a patterning process used to transfer the first color pattern to the substrate and/or the simulated second color pattern is obtained by performing a simulation of the second color pattern based on different values of a processing variable of a patterning process used to transfer the second color pattern to the substrate. In an embodiment, the method further comprises, responsive to a prediction that there would be the defect, adjusting a processing variable for producing the first color pattern and/or the second color pattern so that the defect caused by the overlay error is expected to be reduced. In an embodiment, the processing variable comprises one or more selected from: a dose for producing the first color pattern, a focus for producing the first color pattern, an optical aberration associated with producing the first color pattern, a dose for producing the second color pattern, a second focus for producing the second color pattern, and/or an optical aberration associated with producing the second color pattern. In an embodiment, the first color pattern and/or the second color pattern includes a feature of an integrated circuit pattern. In an embodiment, the first color pattern is produced on the substrate using at least a portion of a first patterning device, and the second color pattern is produced on the substrate using at least a portion of a second patterning device. In an embodiment, the first color pattern is for a different layer on the substrate than a layer for the second color pattern.

In an embodiment, there is provided a method comprising: obtaining a plurality of distance or overlap vectors based on a simulated first color pattern and a simulated second color pattern; and predicting, by a hardware computer system, whether there would be a defect caused by overlay error based on the plurality of distance or overlap vectors and a measurement of overlay error between the first color pattern and the second color pattern.

In an embodiment, each of the distance or overlap vectors has an amplitude representing a minimal gap distance or overlap between a respective feature of the first color pattern and a respective feature of the second color pattern, the amplitude being within a hot spot threshold. In an embodiment, each of the distance or overlap vectors has a direction indicating a relative position between a respective feature of the first color pattern and a respective feature of the second color pattern. In an embodiment, the obtaining comprises: creating a hot spot profile including a plurality of data points, each of the plurality of data points representing one of the plurality of distance or overlap vectors, and determining a region of the hot spot profile, the region excluding substantially all of the plurality of data points, and wherein the predicting comprises: determining a defect prediction vector based on the measured overlay error, and predicting whether there would be the defect based on the defect prediction vector and the region. In an embodiment, it is predicted that there would be the defect caused by the overlay error responsive to a combination of the defect prediction vector and one of more of the plurality of data points falling within the region. In an embodiment, it is predicted that there would be no defect caused by the overlay error responsive to combination of the defect prediction vector and substantially all of the plurality of data points falling outside the region. In an embodiment, the obtaining comprises determining a zone within the region by shrinking a contour of the region by an amount characterized at least in part by a defect threshold, and wherein the predicting comprises predicting whether there would be the defect based on the defect prediction vector and the zone. In an embodiment, it is predicted that there would be the defect caused by the overlay error responsive to a combination of the defect prediction vector and one of more of the plurality of data points falling within the zone. In an embodiment, it is predicted that there would be no defect caused by the overlay error responsive to combination of the defect prediction vector and substantially all of the plurality of data points falling outside the zone. In an embodiment, the determining the zone comprises: obtaining a plurality of points on the contour of the region; obtaining a plurality of points on a contour of the zone which are a function of the shift of each of the plurality of points on the contour of the region toward a center of the region by a distance or overlap amount characterized by the defect threshold; and forming the contour of the zone by connecting the obtained plurality of points on the contour of the zone. In an embodiment, the method further comprises simulating, based on a mathematical model, the first color pattern and the second color pattern using a plurality of processing variables of a patterning process used to transfer the first and second color patterns to a substrate. In an embodiment, the simulated first color pattern is obtained by performing a simulation of the first color pattern based on different values of a processing variable of a patterning process used to transfer the first color pattern to the substrate and/or the simulated second color pattern is obtained by performing a simulation of the second color pattern based on different values of a processing variable of a patterning process used to transfer the second color pattern to the substrate. In an embodiment, the method further comprises, responsive to a prediction that there would be the defect, adjusting a processing variable for producing the first color pattern and/or the second color pattern so that the defect caused by the overlay error is expected to be reduced. In an embodiment, the processing variable comprises one or more selected from: a dose for producing the first color pattern, a focus for producing the first color pattern, an optical aberration associated with producing the first color pattern, a dose for producing the second color pattern, a second focus for producing the second color pattern, and/or an optical aberration associated with producing the second color pattern. In an embodiment, the first color pattern and/or the second color pattern includes a feature of an integrated circuit pattern. In an embodiment, the first color pattern is produced on the substrate using at least a portion of a first patterning device, and the second color pattern is produced on the substrate using at least a portion of a second patterning device.

Figure 17:
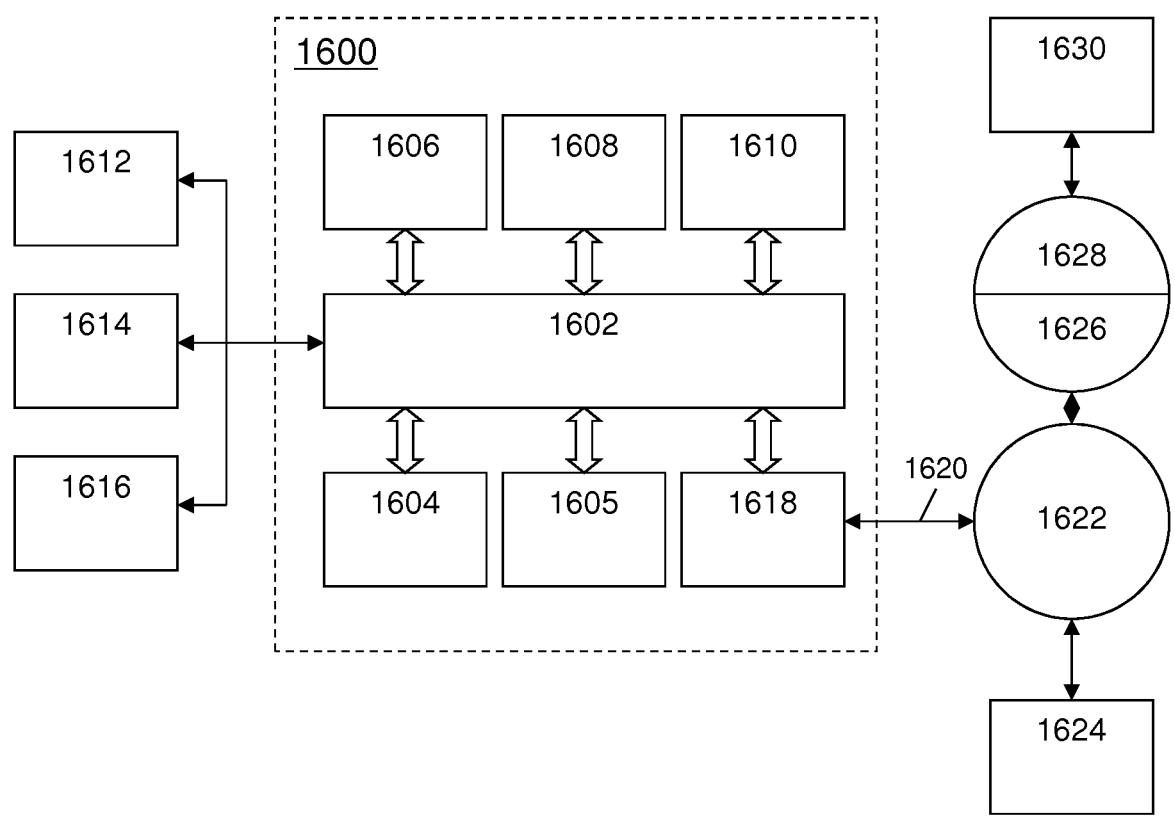
FIG. 17 schematically depicts an example computer system in which embodiments can be implemented.

FIG. 17 is a block diagram that illustrates a computer system 1600 that can assist in implementing the methods and flows disclosed herein. Computer system 1600 includes a bus 1602 or other communication mechanism for communicating information, and a processor 1604 (or multiple processors 1604 and 1605) coupled with bus 1602 for processing information. Computer system 1600 also includes a main memory 1606, such as a random access memory (RAM) or other dynamic storage device, coupled to bus 1602 for storing information and instructions to be executed by processor 1604. Main memory 1606 also may be used for storing temporary variables or other intermediate information during execution of instructions to be executed by processor 1604. Computer system 1600 further includes a read only memory (ROM) 1608 or other static storage device coupled to bus 1602 for storing static information and instructions for processor 1604. A storage device 1610, such as a magnetic disk or optical disk, is provided and coupled to bus 1602 for storing information and instructions.

Computer system 1600 may be coupled via bus 1602 to a display 1612, such as a cathode ray tube (CRT) or flat panel or touch panel display for displaying information to a computer user. An input device 1614, including alphanumeric and other keys, is coupled to bus 1602 for communicating information and command selections to processor 1604. Another type of user input device is cursor control 1616, such as a mouse, a trackball, or cursor direction keys for communicating direction information and command selections to processor 1604 and for controlling cursor movement on display 1612. This input device typically has two degrees of freedom in two axes, a first axis (e.g., x) and a second axis (e.g., y), that allows the device to specify positions in a plane. A touch panel (screen) display may also be used as an input device.

According to one embodiment, one or more of the methods as described herein can be performed by computer system 1600 in response to processor 1604 executing one or more sequences of one or more instructions contained in main memory 1606. Such instructions may be read into main memory 1606 from another computer-readable medium, such as storage device 1610. Execution of the sequences of instructions contained in main memory 1606 causes processor 1604 to perform the process steps described herein. One or more processors in a multi-processing arrangement may also be employed to execute the sequences of instructions contained in main memory 1606. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 1604 for execution. Such a medium may take many forms, including but not limited to, non-volatile media, volatile media, and transmission media. Non-volatile media include, for example, optical or magnetic disks, such as storage device 1610. Volatile media include dynamic memory, such as main memory 1606. Transmission media include coaxial cables, copper wire and fiber optics, including the wires that comprise bus 1602. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1604 for execution. For example, the instructions may initially be borne on a magnetic disk of a remote computer. The remote computer can load the instructions into its dynamic memory and send the instructions over a telephone line using a modem. A modem local to computer system 1600 can receive the data on the telephone line and use an infrared transmitter to convert the data to an infrared signal. An infrared detector coupled to bus 1602 can receive the data carried in the infrared signal and place the data on bus 1602. Bus 1602 carries the data to main memory 1606, from which processor 1604 retrieves and executes the instructions. The instructions received by main memory 1606 may optionally be stored on storage device 1610 either before or after execution by processor 1604.

Computer system 1600 also preferably includes a communication interface 1618 coupled to bus 1602. Communication interface 1618 provides a two-way data communication coupling to a network link 1620 that is connected to a local network 1622. For example, communication interface 1618 may be an integrated services digital network (ISDN) card or a modem to provide a data communication connection to a corresponding type of telephone line. As another example, communication interface 1618 may be a local area network (LAN) card to provide a data communication connection to a compatible LAN. Wireless links may also be implemented. In any such implementation, communication interface 1618 sends and receives electrical, electromagnetic or optical signals that carry digital data streams representing various types of information.

Network link 1620 typically provides data communication through one or more networks to other data devices. For example, network link 1620 may provide a connection through local network 1622 to a host computer 1624 or to data equipment operated by an Internet Service Provider (ISP) 1626. ISP 1626 in turn provides data communication services through the worldwide packet data communication network, now commonly referred to as the "Internet" 1628. Local network 1622 and Internet 1628 both use electrical, electromagnetic or optical signals that carry digital data streams. The signals through the various networks and the signals on network link 1620 and through communication interface 1618, which carry the digital data to and from computer system 1600, are exemplary forms of carrier waves transporting the information.

Computer system 1600 can send messages and receive data, including program code, through the network(s), network link 1620, and communication interface 1618. In the Internet example, a server 1630 might transmit a requested code for an application program through Internet 1628, ISP 1626, local network 1622 and communication interface 1618. One such downloaded application may provide for one or more of the techniques described herein, for example. The received code may be executed by processor 1604 as it is received, and/or stored in storage device 1610, or other non-volatile storage for later execution. In this manner, computer system 1600 may obtain application code in the form of a carrier wave.

In association with an imaging apparatus such as a SEM, an embodiment may include a computer program containing one or more sequences of machine-readable instructions describing a method of detecting and representing an imaged structure, registering a template image object representing the imaged structure against a reference image object, and/or predicting a change in a structure based on variation in a variable during a patterning process. This computer program may be included, for example, with or within the apparatus of FIG. 1 or FIG. 3A and/or with or within the control unit LACU of FIG. 2. There may also be provided a data storage medium (e.g., semiconductor memory, magnetic or optical disk) having such a computer program stored therein. Where an existing apparatus, for example of the type shown in FIGS. 1, 2, and 3A, is already in production and/or in use, an embodiment can be implemented by the provision of updated computer program products for causing a processor of the apparatus to perform a method as described herein.

The embodiments may further be described using the following clauses:

1. A method comprising:
    determining a first color pattern and a second color pattern associated with a hot spot of a design layout pattern, the design layout pattern configured for transfer to a substrate; and
    predicting, by a hardware computer system, whether there would be a defect at the hot spot on the substrate caused by overlay error, based at least in part on a measurement of an overlay error between the first color pattern and the second color pattern.

2. The method of clause 1, wherein the predicting comprises:
  obtaining an overlay error threshold;
  comparing the measured overlay error with the overlay error threshold; and
  predicting whether there would be the defect at the hot spot based on a resullt of the comparing.

3. The method of clause 2, wherein the defect is predicted at the hot spot responsive to a value of the measured overlay error being equal to or greater than the amplitude of the overlay error threshold.

4. The method of clause 2, wherein no defect is predicted at the hot spot responsive to a value of the measured overlay error being smaller than or equal to the amplitude of the overlay error threshold.

5. The method of any of clauses 2 to 4, wherein obtaining the overlay error threshold comprises determining a value of an overlay error between the first color pattern and the second color pattern such that a distance or overlap amount between a simulated first color pattern and a simulated second color pattern based on the overlay error satisfies a defect threshold.

6. The method of clause 5, wherein the simulated first color pattern is obtained by performing a simulation of the first color pattern based on different values of a processing variable of a patterning process used to transfer the first color pattern to the substrate and/or the simulated second color pattern is obtained by performing a simulation of the second color pattern based on different values of a processing variable of a patterning process used to transfer the second color pattern to the substrate.

7. The method of any of clauses 1 to 9, further comprising, responsive to a prediction there would be the defect, adjusting a processing variable for producing the first color pattern and/or the second color pattern so that the defect caused by the overlay error is expected to be reduced.

8. The method of clause 7, wherein the processing variable comprises one or more selected from: a dose for producing the first color pattern, a focus for producing the first color pattern, an optical aberration associated with producing the first color pattern, a dose for producing the second color pattern, a second focus for producing the second color pattern, and/or an optical aberration associated with producing the second color pattern.

9. The method of any of clauses 1 to 8, wherein the first color pattern and/or the second color pattern includes a feature of an integrated circuit pattern.

10. The method of any of clauses 1 to 9, wherein the first color pattern is produced on the substrate using at least a portion of a first patterning device, and the second color pattern is produced on the substrate using at least a portion of a second patterning device.

11. The method of any of clauses 1 to 10, wherein the first color pattern is for a different layer on the substrate than a layer for the second color pattern.

12. A method comprising:
  obtaining an overlay error threshold between a first color pattern and a second color pattern by simulation of the first color pattern and the second color pattern; and
  predicting, by a hardware computer system, whether there would be a defect caused by overlay error, based at least in part on the overlay error threshold and a measurement of an overlay error between the first color pattern and the measured color pattern.

13. The method of clause 12, wherein the predicting comprises:
  selecting one of a plurality of overlay error thresholds, the selected overlay error threshold having at least a directional component in the same direction as that of the measured overlay error;
  comparing the measured overlay error with the selected overlay error threshold; and
  predicting whether there would be the defect based on a result of the comparing.

14. The method of clause 13, wherein it is predicted that there would be the defect responsive to a value of the measured overlay error is equal to or greater than the amplitude of the selected overlay error threshold.

15. The method of clause 13, wherein no defect is predicted responsive to a value of the measured overlay error being smaller than or equal to the amplitude of the overlay error threshold.

16. The method of any of clauses 12 to 15, wherein obtaining the overlay error threshold comprises determining a value of an overlay error between the first color pattern and the second color pattern such that a distance or overlap amount between the simulated first color pattern and the simulated second color pattern based on the overlay error satisfies a defect threshold.

17. The method of any of clauses 12 to 16, wherein the simulated first color pattern is obtained by performing a simulation of the first color pattern based on different values of a processing variable of a patterning process used to transfer the first color pattern to the substrate and/or the simulated second color pattern is obtained by performing a simulation of the second color pattern based on different values of a processing variable of a patterning process used to transfer the second color pattern to the substrate.

18. The method of any of clauses 12 to 17, further comprising, responsive to a prediction that there would be the defect, adjusting a processing variable for producing the first color pattern and/or the second color pattern so that the defect caused by the overlay error is expected to be reduced.

19. The method of clause 18, wherein the processing variable comprises one or more selected from: a dose for producing the first color pattern, a focus for producing the first color pattern, an optical aberration associated with producing the first color pattern, a dose for producing the second color pattern, a second focus for producing the second color pattern, and/or an optical aberration associated with producing the second color pattern.

20. The method of any of clauses 12 to 19, wherein the first color pattern and/or the second color pattern includes a feature of an integrated circuit pattern.

21. The method of any of clauses 12 to 20, wherein the first color pattern is produced on the substrate using at least a portion of a first patterning device, and the second color pattern is produced on the substrate using at least a portion of a second patterning device.

22. The method of any of clauses 12 to 21, wherein the first color pattern is for a different layer on the substrate than a layer for the second color pattern.

23. A method comprising:
  obtaining a plurality of distance or overlap vectors based on a simulated first color pattern and a simulated second color pattern; and
  predicting, by a hardware computer system, whether there would be a defect caused by overlay error based on the plurality of distance or overlap vectors and a measurement of overlay error between the first color pattern and the second color pattern.

24. The method of clause 23, wherein each of the distance or overlap vectors has an amplitude representing a minimal gap distance or overlap between a respective feature of the first color pattern and a respective feature of the second color pattern, the amplitude being within a hot spot threshold.

25. The method of clause 23 or clause 24, wherein each of the distance or overlap vectors has a direction indicating a relative position between a respective feature of the first color pattern and a respective feature of the second color pattern.

26. The method of any of clauses 23 to 25, wherein the obtaining comprises:
creating a hot spot profile including a plurality of data points, each of the plurality of data points representing one of the plurality of distance or overlap vectors, and
determining a region of the hot spot profile, the region excluding substantially all of the plurality of data points, and
wherein the predicting comprises:
determining a defect prediction vector based on the measured overlay error, and
predicting whether there would be the defect based on the defect prediction vector and the region.

27. The method of clause 26, wherein it is predicted that there would be the defect caused by the overlay error responsive to a combination of the defect prediction vector and one or more of the plurality of data points falling within the region.

28. The method of clause 26 or clause 27, wherein it is predicted that there would be no defect caused by the overlay error responsive to combination of the defect prediction vector and substantially all of the plurality of data points falling outside the region.

29. The method of any of clauses 26 to 28, wherein the obtaining comprises determining a zone within the region by shrinking a contour of the region by an amount characterized at least in part by a defect threshold, and wherein the predicting comprises predicting whether there would be the defect based on the defect prediction vector and the zone.

30. The method of clause 29, wherein it is predicted that there would be the defect caused by the overlay error responsive to a combination of the defect prediction vector and one or more of the plurality of data points falling within the zone.

31. The method of clause 29 or clause 30, wherein it is predicted that there would be no defect caused by the overlay error responsive to combination of the defect prediction vector and substantially all of the plurality of data points falling outside the zone.

32. The method of any of clauses 29 to 31, wherein the determining the zone comprises:
obtaining a plurality of points on the contour of the region;
obtaining a plurality of points on a contour of the zone which are a function of the shift of each of the plurality of points on the contour of the region toward a center of the region by a distance or overlap amount characterized by the defect threshold; and
forming the contour of the zone by connecting the obtained plurality of points on the contour of the zone.

33. The method of any of clauses 23 to 32, further comprising simulating, based on a mathematical model, the first color pattern and the second color pattern using a plurality of processing variables of a patterning process used to transfer the first and second color patterns to a substrate.

34. The method of any of clauses 23 to 33, wherein the simulated first color pattern is obtained by performing a simulation of the first color pattern based on different values of a processing variable of a patterning process used to transfer the first color pattern to the substrate and/or the simulated second color pattern is obtained by performing a simulation of the second color pattern based on different values of a processing variable of a patterning process used to transfer the second color pattern to the substrate.

35. The method of any of clauses 21 to 34, further comprising, responsive to a prediction that there would be the defect, adjusting a processing variable for producing the first color pattern and/or the second color pattern so that the defect caused by the overlay error is expected to be reduced.

36. The method of clause 35, wherein the processing variable comprises one or more selected from: a dose for producing the first color pattern, a focus for producing the first color pattern, an optical aberration associated with producing the first color pattern, a dose for producing the second color pattern, a second focus for producing the second color pattern, and/or an optical aberration associated with producing the second color pattern.

37. The method of any of clauses 23 to 36, wherein the first color pattern and/or the second color pattern includes a feature of an integrated circuit pattern.

38. The method of any of clauses 23 to 37, wherein the first color pattern is produced on the substrate using at least a portion of a first patterning device, and the second color pattern is produced on the substrate using at least a portion of a second patterning device.

39. A non-transitory computer program product comprising machine-readable instructions configured to cause a processor to cause performance of the method of any of clauses 1 to 38.

40. A system comprising:
an inspection apparatus configured to measure an overlay error between a first color pattern and a second color pattern on a substrate; and
a defect prediction engine comprising a non-transitory computer program product of clause 39.

41. The system of clause 40, further comprising a lithographic apparatus comprising a support structure configured to hold a patterning device to modulate a radiation beam and a projection optical system arranged to project the modulated onto a radiation-sensitive substrate.

The term "optimizing" and "optimization" as used herein mean adjusting an apparatus or process, e.g., a lithographic apparatus or an optical lithography process step, such that patterning and/or device fabrication results and/or processes (e.g., of lithography) have one or more desirable characteristics, such as higher accuracy of projection of a design layout on a substrate, larger process window, etc.

An embodiment of the invention may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

Although specific reference may have been made above to the use of embodiments in the context of optical lithography, it will be appreciated that an embodiment of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further, although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after pattern transfer, in for example a track (a tool that typically applies a layer of resist to a substrate and develops the patterned resist), an inspection tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below. For example, one or more aspects of one or more embodiments may be combined with or substituted for one or more aspects of one or more other embodiments as appropriate. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the invention should not be limited by any of the above-described exemplary embodiments, but should be defined only in accordance with the following claims and their equivalents.

What is claimed is:

1. A method comprising:
   determining a first color pattern and a second color pattern associated with a hot spot of a design layout pattern, the design layout pattern configured for transfer to a substrate; and
   predicting, by a hardware computer system, whether there would be a defect at the hot spot on the substrate caused by overlay error, based at least in part on a measured overlay error between the first color pattern and the second color pattern from a physical substrate.

2. The method of claim 1, wherein the predicting comprises:
   obtaining an overlay error threshold;
   comparing the measured overlay error with the overlay error threshold; and
   predicting whether there would be the defect at the hot spot based on a result of the comparing.

3. The method of claim 2, wherein a value of the measured overlay error is equal to or greater than the amplitude of the overlay error threshold and the defect is predicted at the hot spot responsive to the value of the measured overlay error being equal to or greater than the amplitude of the overlay error threshold.

4. The method of claim 2, wherein a value of the measured overlay error is smaller than or equal to the amplitude of the overlay error threshold and no defect is predicted at the hot spot responsive to the value of the measured overlay error being smaller than or equal to the amplitude of the overlay error threshold.

5. The method of claim 2, wherein obtaining the overlay error threshold comprises determining a value of an overlay error between the first color pattern and the second color pattern such that a distance or overlap amount between a simulated first color pattern and a simulated second color pattern based on the overlay error satisfies a defect threshold.

6. The method of claim 5, wherein the simulated first color pattern is obtained by performing a simulation of the first color pattern based on different values of a processing variable of a patterning process used to transfer the first color pattern to the substrate and/or wherein the simulated second color pattern is obtained by performing a simulation of the second color pattern based on different values of a processing variable of a patterning process used to transfer the second color pattern to the substrate.

7. The method of claim 1, wherein the predicting results in a prediction that there would be the defect and further comprising, responsive to the prediction there would be the defect, adjusting a processing variable for producing the first color pattern and/or the second color pattern, based on the overlay error.

8. The method of claim 7, wherein the processing variable comprises one or more selected from: a dose for producing the first color pattern, a focus for producing the first color pattern, an optical aberration associated with producing the first color pattern, a dose for producing the second color pattern, a focus for producing the second color pattern, and/or an optical aberration associated with producing the second color pattern.

9. The method of claim 1, wherein the first color pattern is for a different layer on the substrate than a layer for the second color pattern.

10. A method comprising:
obtaining an overlay error threshold between a first color pattern and a second color pattern by simulation of the first color pattern and the second color pattern; and
predicting, by a hardware computer system, existence of a defect caused by overlay error, based at least in part on the overlay error threshold and a measured overlay error between the first color pattern and the second color pattern from a physical substrate.

11. The method of claim 10, wherein the predicting comprises:
selecting one of a plurality of overlay error thresholds, the selected overlay error threshold having at least a directional component in the same direction as that of the measured overlay error;
comparing the measured overlay error with the selected overlay error threshold; and
predicting whether there would be the defect based on a result of the comparing.

12. The method of claim 10, wherein obtaining the overlay error threshold comprises determining a value of an overlay error between the first color pattern and the second color pattern such that a distance or overlap amount between the simulation of the first color pattern and the simulation of the second color pattern based on the overlay error satisfies a defect threshold.

13. The method of claim 10, wherein the simulation of the first color pattern is obtained by performing a simulation of the first color pattern based on different values of a processing variable of a patterning process used to transfer the first color pattern to the substrate and/or wherein the simulation of the second color pattern is obtained by performing a simulation of the second color pattern based on different values of a processing variable of a patterning process used to transfer the second color pattern to the substrate.

14. The method of claim 10, wherein the predicting results in a prediction that there would be the defect and further comprising, responsive to the prediction that there would be the defect, adjusting a processing variable for producing the first color pattern and/or the second color pattern, based on the overlay error.

15. A non-transitory computer program product comprising machine-readable instructions therein, the instructions, upon execution by a processor system, are configured to cause the processor system to at least:
obtain a first color pattern and a second color pattern associated with a hot spot of a design layout pattern, the design layout pattern configured for transfer to a substrate; and
predict whether there would be a defect at the hot spot on the substrate caused by overlay error, based at least in part on a measured overlay error between the first color pattern and the second color pattern taken from a physical substrate.

16. The computer program product of claim 15, wherein the instructions are further configured to, responsive to a prediction there would be the defect, adjust a processing variable for producing the first color pattern and/or the second color pattern so that the defect caused by the overlay error is expected to be reduced.

17. The computer program product of claim 16, wherein the processing variable comprises one or more selected from: a dose for producing the first color pattern, a focus for producing the first color pattern, an optical aberration associated with producing the first color pattern, a dose for producing the second color pattern, a focus for producing the second color pattern, and/or an optical aberration associated with producing the second color pattern.

18. The computer program product of claim 15, wherein the instructions configured to predict whether there would be a defect at the hot spot are further configured to:
obtain an overlay error threshold by determining a value of an overlay error between the first color pattern and the second color pattern such that a distance or overlap amount between a simulated first color pattern and a simulated second color pattern based on the overlay error satisfies a defect threshold;
compare the measured overlay error with the overlay error threshold; and
predict whether there would be the defect at the hot spot based on a result of the comparison.

19. The computer program product of claim 18, wherein the instructions are further configured to perform a simulation of the first color pattern based on different values of a processing variable of a patterning process used to transfer the first color pattern to the substrate to obtain the simulated first color pattern and/or perform a simulation of the second color pattern based on different values of a processing variable of a patterning process used to transfer the second color pattern to the substrate to obtain the simulated second color pattern.

20. The computer program product of claim 15, wherein the first color pattern is for a different layer on the substrate than a layer for the second color pattern.

21. A non-transitory computer program product comprising machine-readable instructions therein, the instructions, upon execution by a processor system, are configured to cause the processor system to at least:
obtain an overlay error threshold between a first color pattern and a second color pattern by simulation of the first color pattern and the second color pattern; and
predict existence of a defect caused by overlay error, based at least in part on the overlay error threshold and a measured overlay error between the first color pattern and the second color pattern taken from a physical substrate.

* * * * *